(12) United States Patent
Chang et al.

(10) Patent No.: US 11,710,777 B2
(45) Date of Patent: Jul. 25, 2023

(54) SEMICONDUCTOR DEVICE AND METHOD FOR MANUFACTURE

(71) Applicant: Taiwan Semiconductor Manufacturing Co., Ltd., Hsinchu (TW)

(72) Inventors: Chia-Ao Chang, Jinhu Township (TW); De-Wei Yu, Ping-tung (TW); Chii-Horng Li, Zhubei (TW); Yee-Chia Yeo, Hsinchu (TW); Hsueh-Chang Sung, Zhubei (TW); Pei-Ren Jeng, Chu-Bei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 121 days.

(21) Appl. No.: 17/081,675

(22) Filed: Oct. 27, 2020

(65) Prior Publication Data

US 2022/0130979 A1    Apr. 28, 2022

(51) Int. Cl.
*H01L 21/324* (2006.01)
*H01L 29/66* (2006.01)
*H01L 21/02* (2006.01)
*H01L 21/3213* (2006.01)

(52) U.S. Cl.
CPC .. *H01L 29/66545* (2013.01); *H01L 21/02071* (2013.01); *H01L 21/32135* (2013.01); *H01L 29/66795* (2013.01)

(58) Field of Classification Search
None
See application file for complete search history.

(56) References Cited

U.S. PATENT DOCUMENTS

| | | | |
|---|---|---|---|
| 10,115,639 B2 | 10/2018 | Li et al. | |
| 10,504,747 B2 | 12/2019 | Yu et al. | |
| 2017/0365674 A1* | 12/2017 | Lee | H01L 27/0886 |
| 2018/0151693 A1* | 5/2018 | Li | H01L 21/2022 |
| 2018/0315752 A1* | 11/2018 | Fan | H01L 21/0223 |
| 2019/0165125 A1* | 5/2019 | Lai | H01L 29/4983 |
| 2020/0044048 A1 | 2/2020 | Yu et al. | |
| 2020/0105605 A1 | 4/2020 | Teng et al. | |
| 2021/0091222 A1* | 3/2021 | Ch | H01L 29/7851 |
| 2021/0119013 A1 | 4/2021 | Chen et al. | |
| 2021/0134976 A1* | 5/2021 | Zhang | H01L 21/823431 |

* cited by examiner

*Primary Examiner* — Joseph C. Nicely
*Assistant Examiner* — Lamont B Koo
(74) *Attorney, Agent, or Firm* — Slater Matsil, LLP

(57) ABSTRACT

A method of forming a semiconductor device includes depositing a film over a dielectric layer. The dielectric layer is over a first fin, a second fin, and within a trench between the first fin and the second fin. The method further includes etching top portions of the film, performing a treatment on the dielectric layer to remove impurities after etching the top portions of the film, and filling the trench over the remaining portions of the film. The treatment includes bombarding the dielectric layer with radicals.

20 Claims, 29 Drawing Sheets

SEMICONDUCTOR DEVICE AND METHOD FOR MANUFACTURE

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
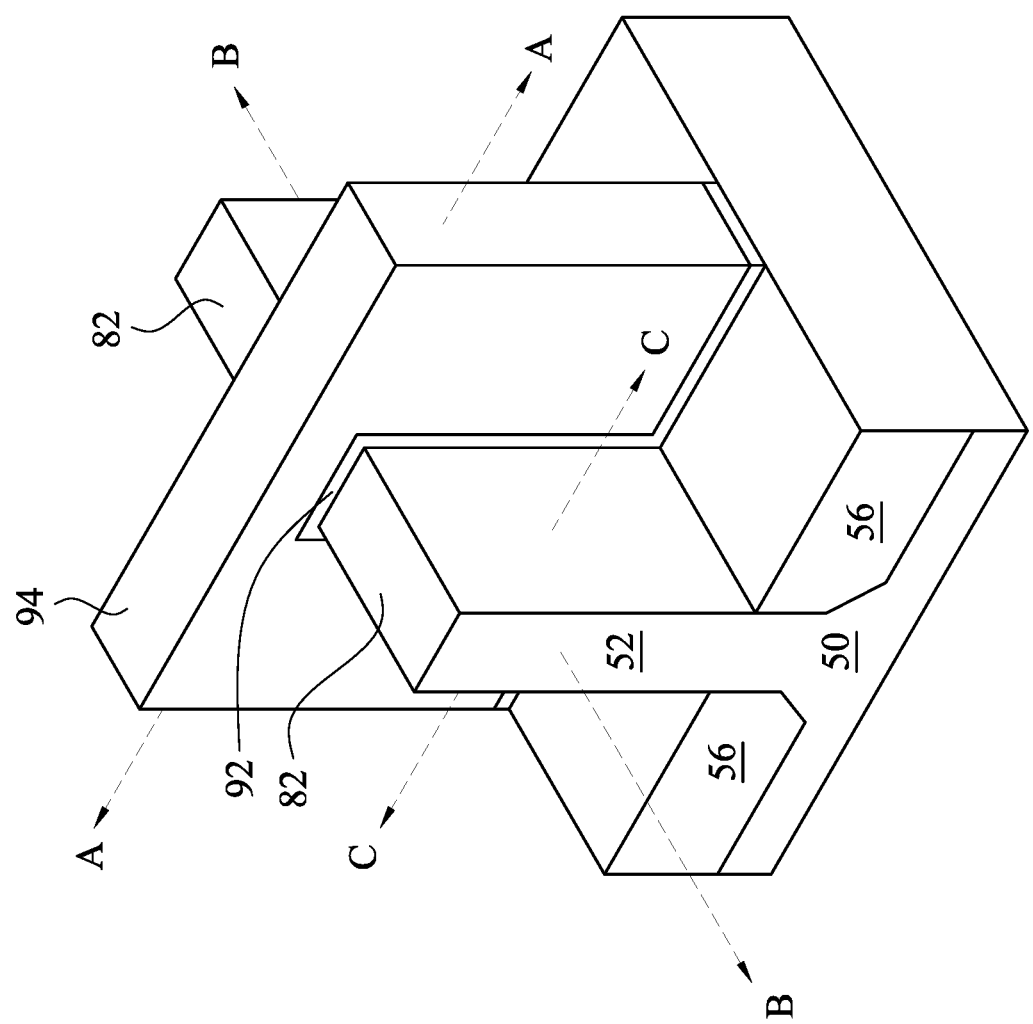
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to a particular embodiment in which a treatment is utilized to remove impurities on a film as part of a gap-filling process in the fabrication of a semiconductor device. The embodiments described, however, are not intended to be limited to the embodiments described herein, and may be utilized in a wide variety of embodiments.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2 through 12 and 17 through 26B are cross-sectional views of intermediate stages in the manufacturing of FinFETs, in accordance with some embodiments. FIGS. 2 through 12 illustrate reference cross-section A-A illustrated in FIG. 1, except for multiple fins/FinFETs. FIGS. 17, 18A, 19A, 20A, 21A, 22A, 23A, 24A, 25A, and 26A are illustrated along reference cross-section A-A illustrated in FIG. 1, and FIGS. 18B, 19B, 20B, 21B, 22B, 23B, 24B, 24C, 25B, and 26B are illustrated along a similar cross-section B-B illustrated in FIG. 1, except for multiple fins/FinFETs. FIGS. 20C and 20D are illustrated along reference cross-section C-C illustrated in FIG. 1, except for multiple fins/FinFETs.

Figure 2:
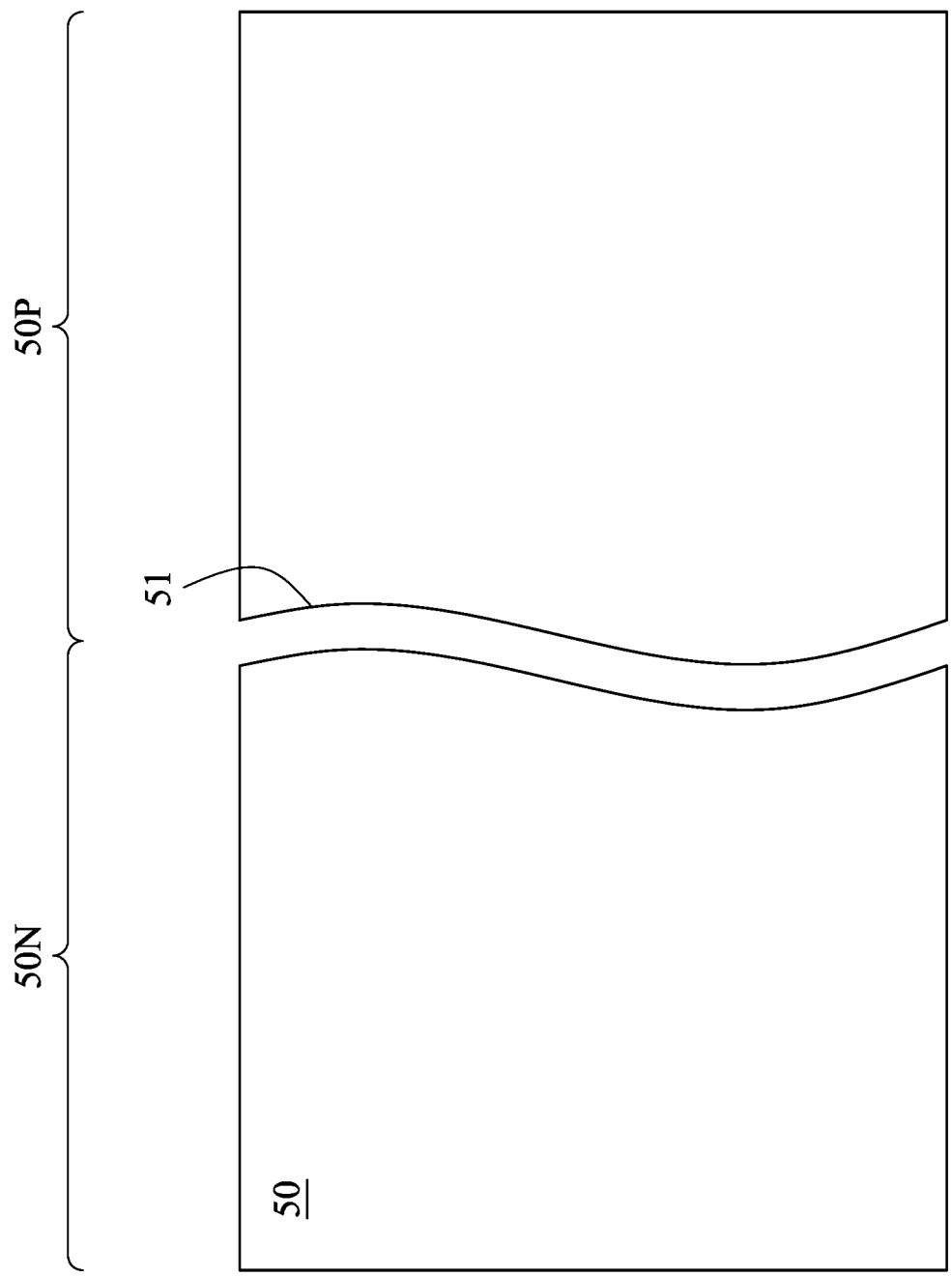
FIGS. 2, 3, 4, 5, 6, 7, 8, 9, 10, 11, and 12 are cross-sectional views of earlier intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P (as illustrated by divider 51), and any number of device features (e.g., other active devices, doped regions, isolation structures, etc.) may be disposed between the n-type region 50N and the p-type region 50P.

Figure 3:
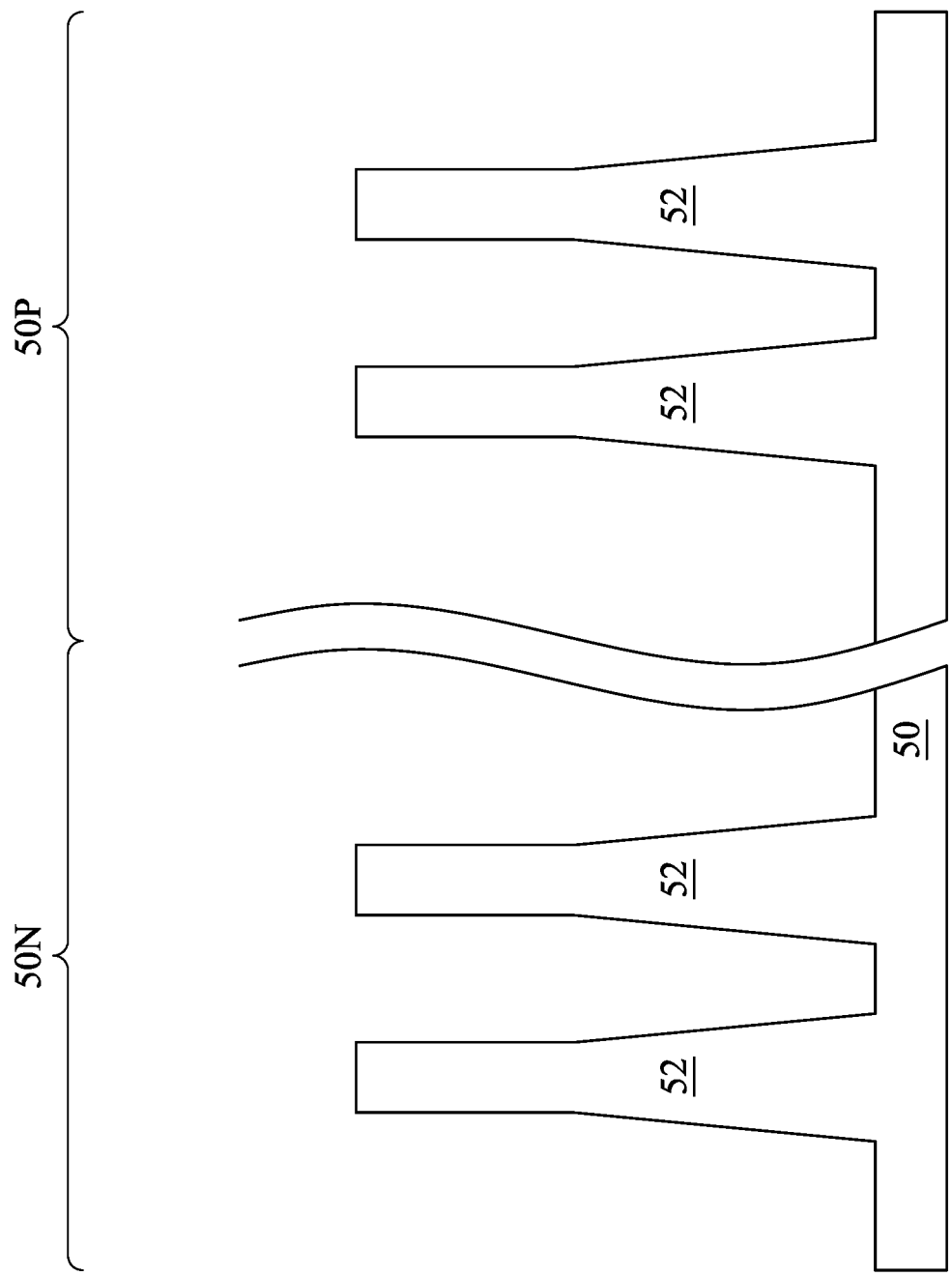

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
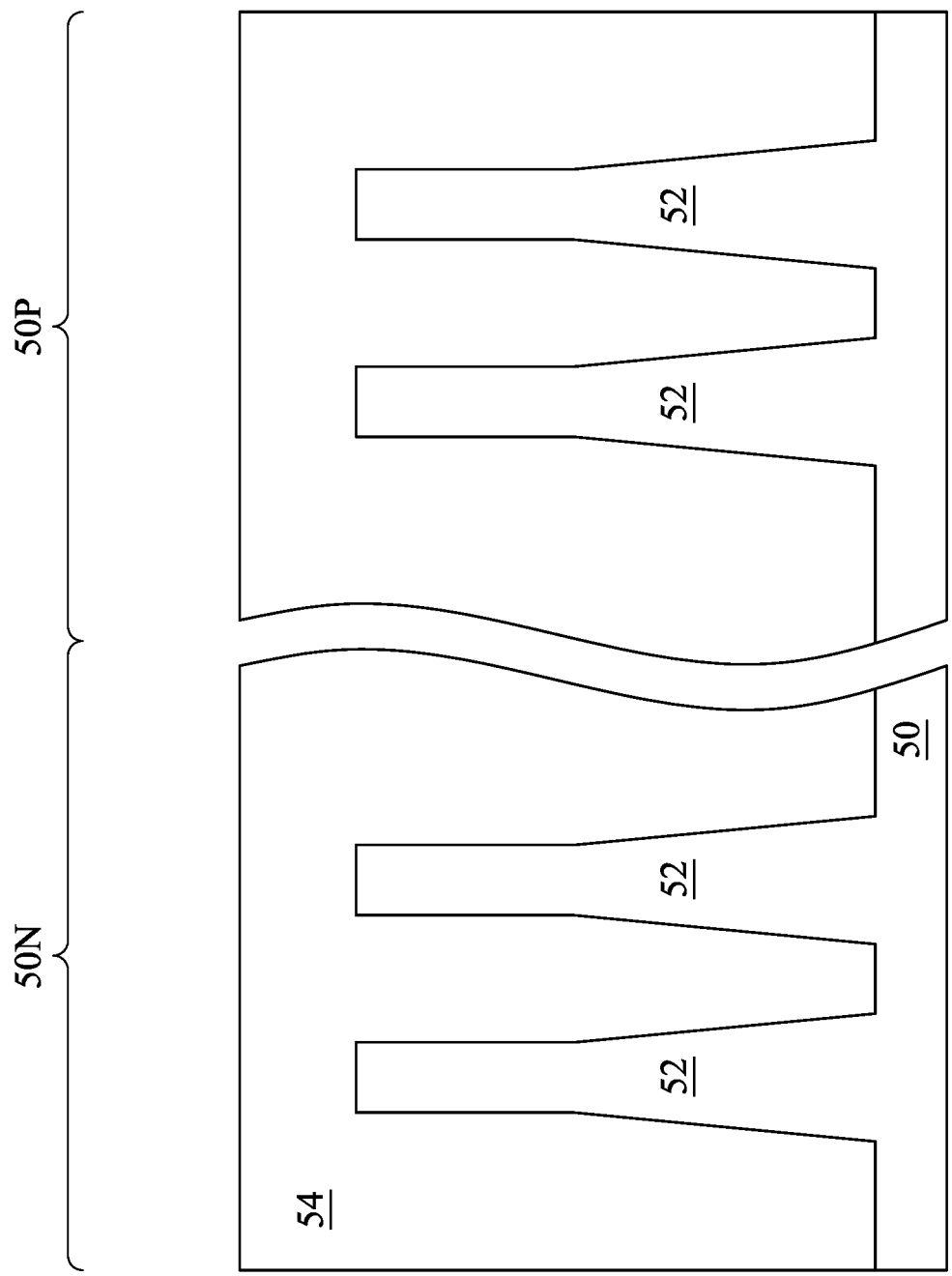

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
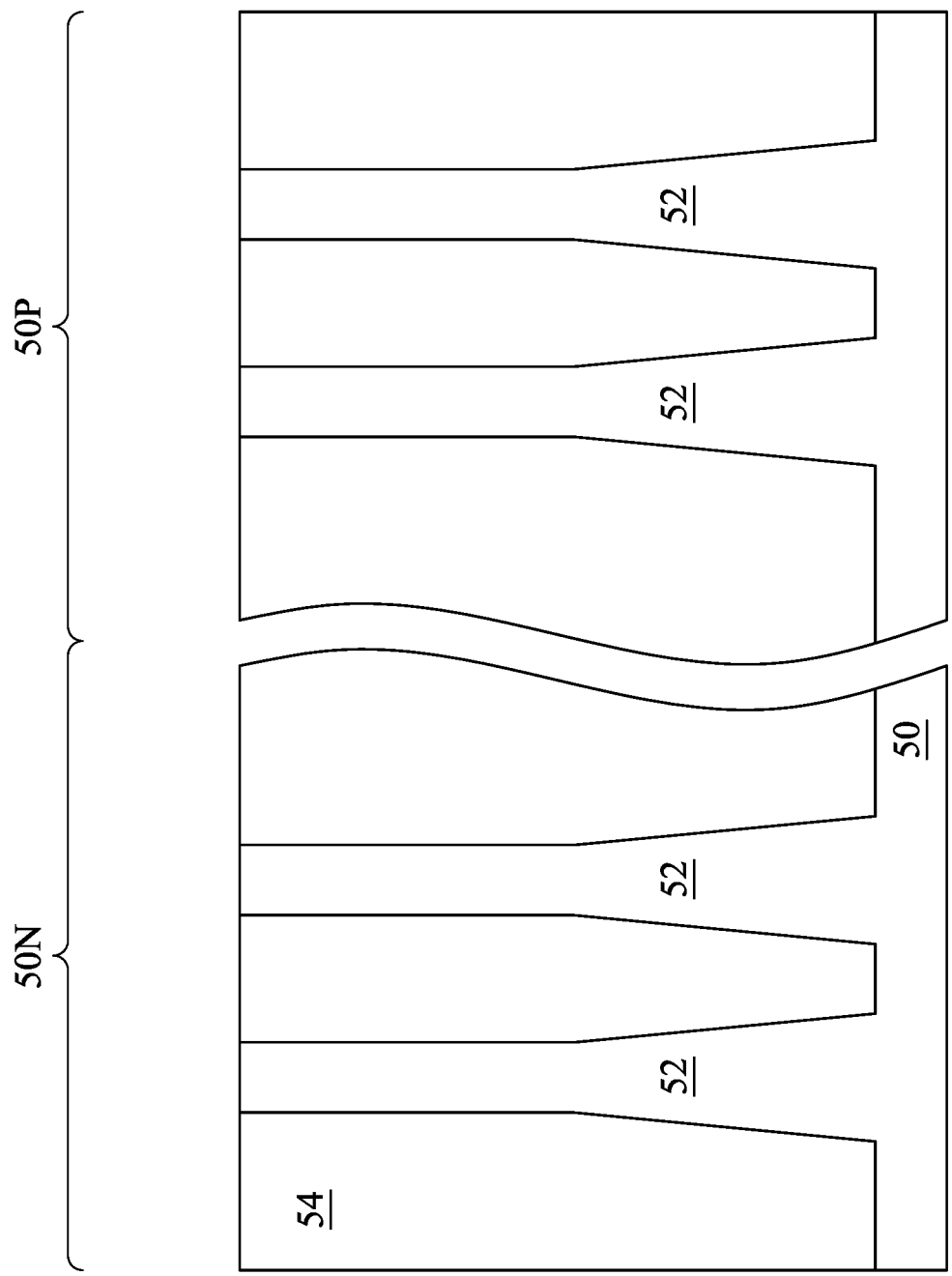

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
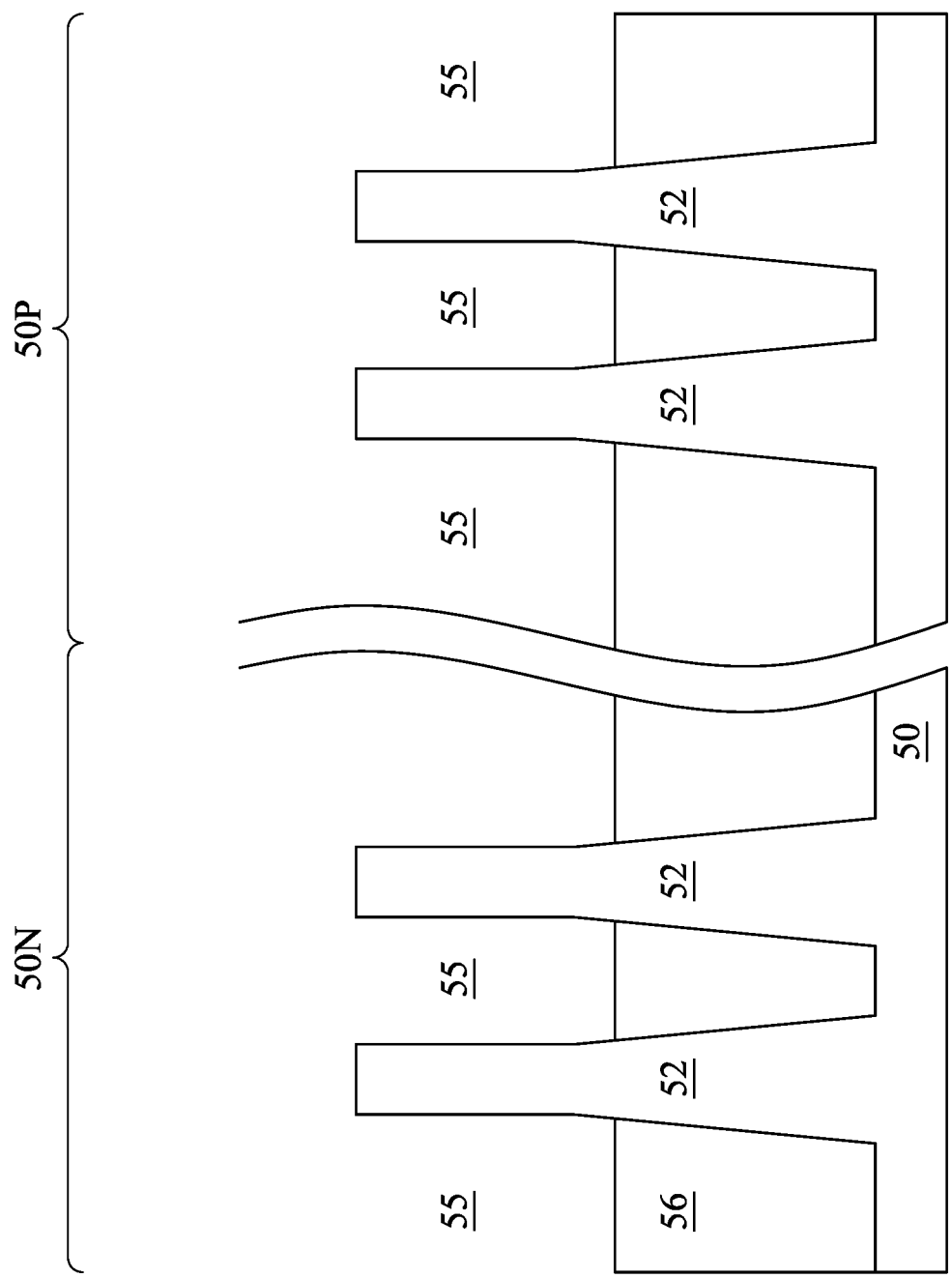

In FIG. 6, the insulation material 54 is recessed to form Shallow Trench Isolation (STI) regions 56. The insulation material 54 is recessed such that upper portions of fins 52 in the n-type region 50N and in the p-type region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

As illustrated in FIG. 6, trenches 55 may be formed between adjacent fins 52. Each of the trenches 55 may have a bottom surface on a top surface of a respective STI region 56 and side surfaces on sidewalls of the respective fins 52. In some embodiments, the trenches 55 may have an aspect ratio of the heights of the trenches 55 to the widths of the trenches 55 in a range of about 3 to about 9. The trenches 55 may have heights equal to the heights of the fins 52 and widths equal to the widths of the STI regions 56 disposed between adjacent fins 52.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 50N (e.g., an NMOS region) different from the material in p-type region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in the n-type region 50N, and an N well may be formed in the p-type region 50P. In some embodiments, a P well or an N well are formed in both the n-type region 50N and the p-type region 50P.

In the embodiments with different well types, the different implant steps for the n-type region 50N and the p-type region 50P may be achieved using a photoresist and/or other masks (not shown). For example, a photoresist may be formed over the fins 52 and the STI regions 56 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implanting of the p-type region 50P, a photoresist is formed over the fins 52 and the STI regions 56 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
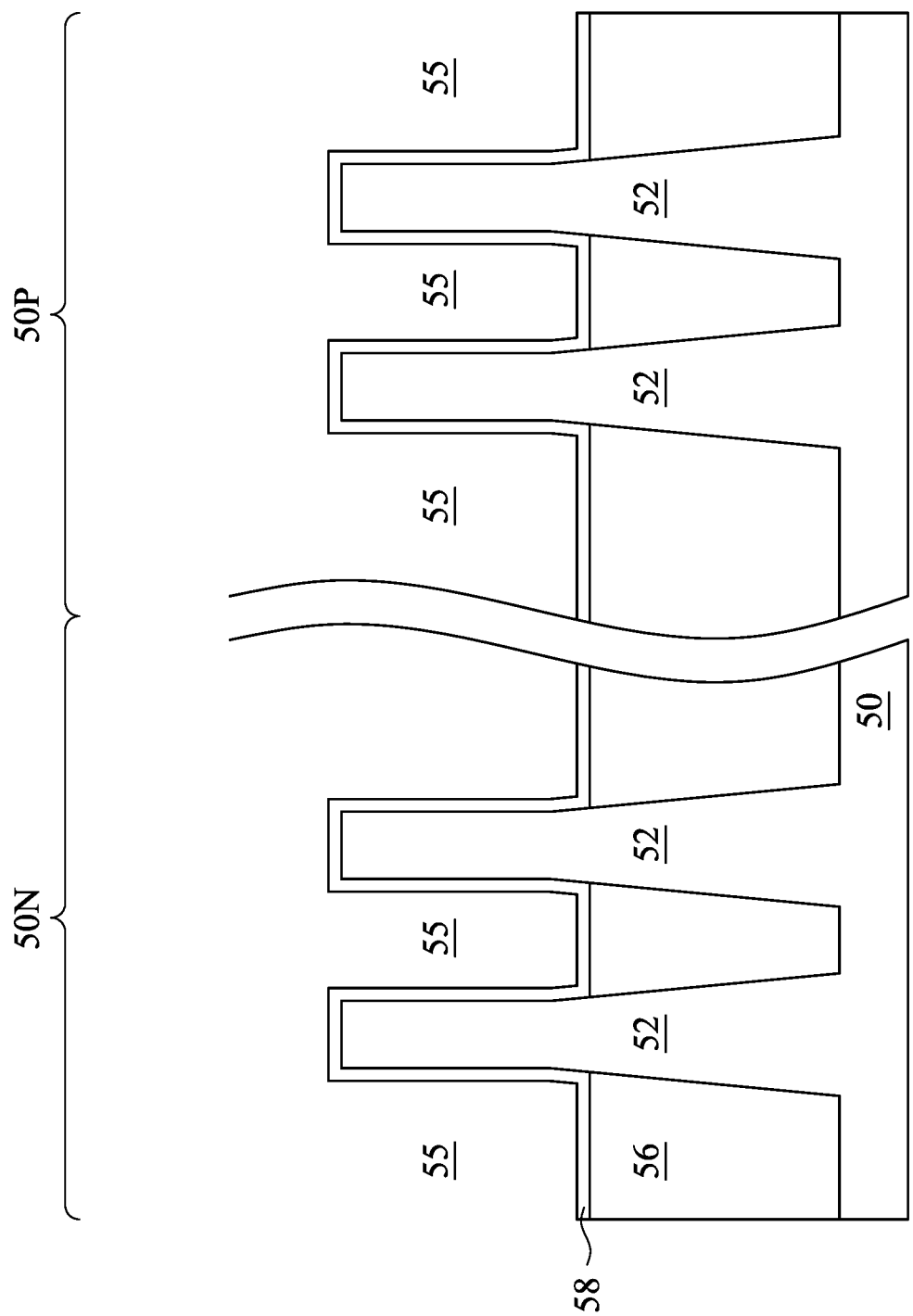

In FIG. 7, a dummy dielectric layer 58 is formed on the fins 52. The dummy dielectric layer 58 may be, for example, silicon oxide, silicon nitride, a combination thereof, or the like, and may be deposited or and/or chemically grown on the fins 52, or conformally deposited, such as by plasma-enhanced chemical vapor deposition (PECVD), atomic layer deposition (ALD), or any suitable deposition technique. It is noted that the dummy dielectric layer 58 is shown covering the fins 52 and the STI regions 56 for illustrative purposes only. In some embodiments, the dummy dielectric layer 58 may be thermally grown according to acceptable techniques such that the dummy dielectric layer 58 covers the fins 52 only, without extending between the fins 52 over the STI regions 56. In some embodiments, residual impurities (not illustrated) may be present on exposed surfaces of the dummy dielectric layer 58 prior to forming the first film 60, from processes such as a cleaning process, an etching process, or as residue from a halogen-containing precursor for forming the dummy dielectric layer 58 such as e.g. chlorosilane or dichlorosilane.

Figure 8:
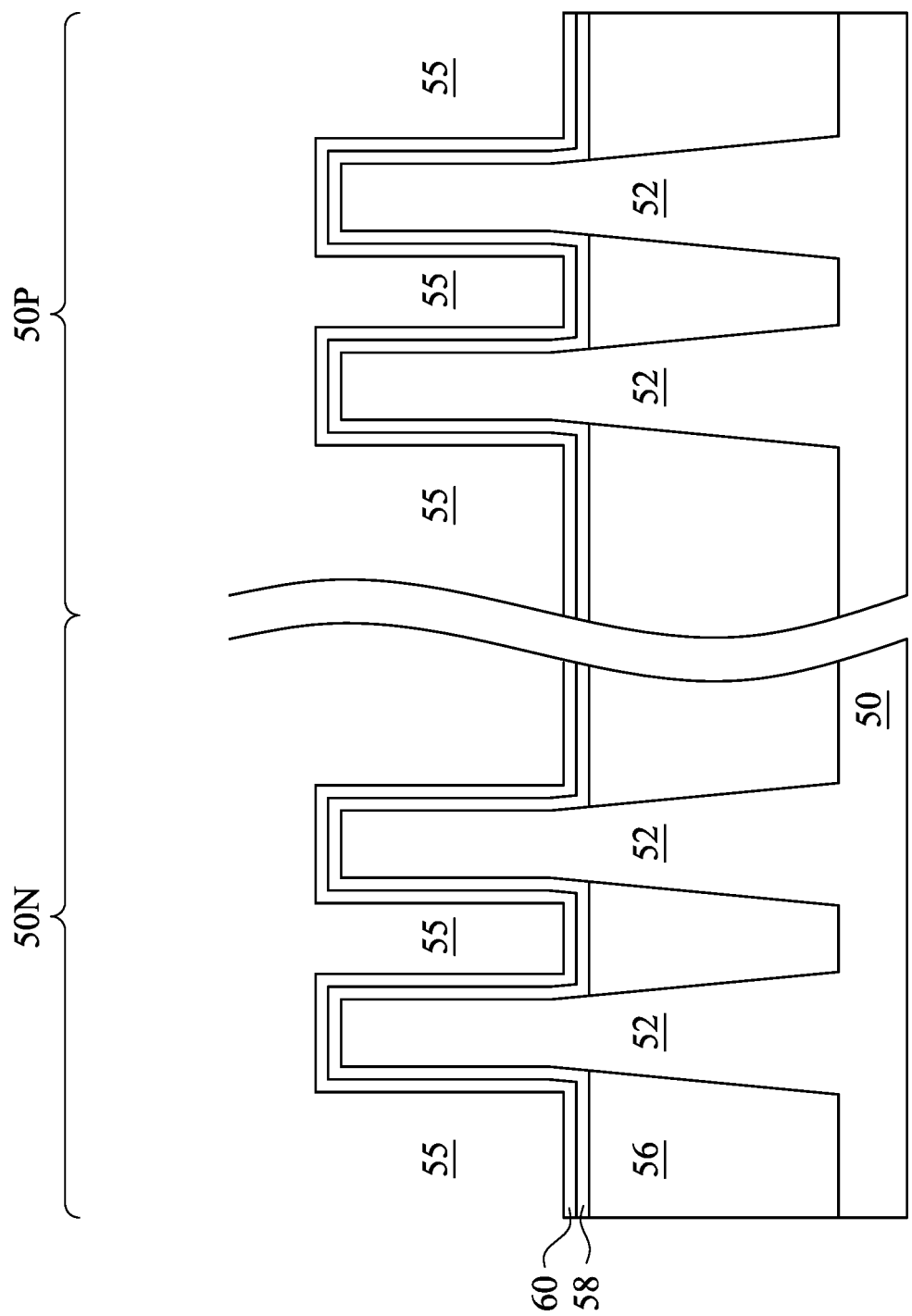

In FIG. 8, a first film 60 is formed over the dummy dielectric layer 58. The first film 60 may be formed as a seed layer to aid in gap-filling of the trenches 55, such as with a subsequently deposited dummy gate layer (such as the dummy gate layer 62, discussed below in reference to FIG. 12). The first film 60 may be chosen depending on the material of the dummy gate layer 62. In embodiments in which the dummy gate layer 62 includes silicon (e.g., polysilicon, amorphous silicon (a-Si), or the like), the first film 60 may be a silicon-containing film. In some embodiments, the first film 60 may include polysilicon or amorphous silicon. The material of the first film 60 may be deposited by a conformal deposition process such as remote plasma CVD (RPCVD), low-pressure CVD (LPCVD), CVD, PECVD, ALD, plasma-enhanced ALD (PEALD), or any suitable deposition process, which may be carried out in a process chamber. The first film 60 may be deposited to a thickness in a range of about 1 nm to about 100 nm.

In an embodiment in which the first film 60 is deposited by CVD (e.g., RPCVD), a silicon-containing precursor may be used during the deposition process to form the first film 60. Suitable silicon-containing precursors may include silanes or the like. The silanes may include silane ($SiH_4$), disilane ($Si_2H_6$), trisilane ($Si_3H_8$), tetrasilane ($Si_4H_{10}$), higher order silanes with the empirical formula $Si_xH_{(2x+2)}$ where x>3, dimethylaminosilane ($SiH_3[N(CH_3)_2]$, DMAS), ethylmethylaminosilane ($SiH_3[N(CH_3C_2H_5)]$, EMAS), diethylaminosilane ($SiH_3[N(C_2H_5)_2]$, DEAS), ethylisopropylaminosilane ($SiH_3[N(C_2H_5C_3H_7)]$, EIPAS), di(isopropylamino)silane ($SiH_3[N(C_3H_7)_2]$, DIPAS), dipropylaminosilane ($SiH_3[N(C_3H_7)_2]$, DPAS), dichlorosilane ($SiH_2Cl_2$), trichlorosilane ($SiHCl_3$), and chlorosilane ($SiH_3Cl$). The silicon-containing precursors may be supplied at a flowrate from about 10 sccm to about 5000 sccm.

The processing chamber may be maintained at a temperature from about 100° C. to about 750° C., such as about 300° C. to about 700° C., during the deposition of the first film 60. The processing chamber may further be maintained at a pressure from about 0.1 Torr to about 0.5 Torr, during the deposition of the first film 60.

Figure 9:
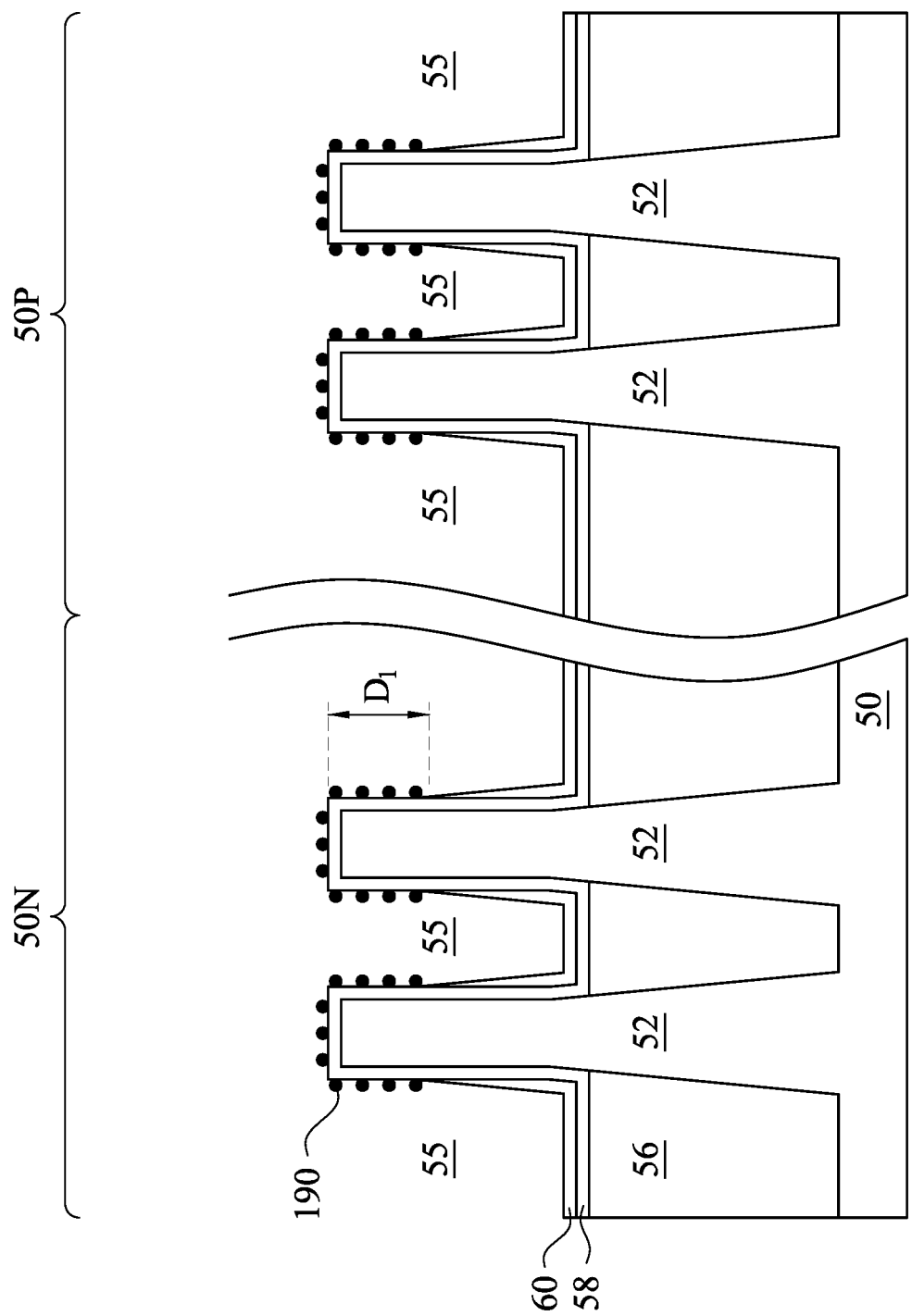

In FIG. 9, the material of the first film 60 is then etched by a suitable etching process, which may leave residual impurities 190 on exposed surfaces of the dummy dielectric layer 58. The etching process may be performed in situ, in the same processing chamber as the deposition process, or in a processing chamber different from that of the deposition process. The etching process may be performed using an etchant gas (e.g., a halogen-containing etchant gas), which may include chlorine ($Cl_2$), hydrogen chloride (HCl), fluorine ($F_2$), hydrogen bromide (HBr), bromine (Br), combinations thereof, or the like. In some embodiments, the etchant gas may be supplied to the processing chamber at a rate from about 0.01 slm to about 5 slm.

The etchant gas may be mixed with additional gases that act as carrier gases, reactive gases, or both. For example, the additional gases may include hydrogen ($H_2$), nitrogen ($N_2$), argon (Ar), combinations thereof, or the like. The additional gases may be supplied at a flowrate less than about 20 slm.

During the etching process, the processing chamber may be maintained at a temperature in a range of about 100° C. to about 700° C. In embodiments in which the etchant gas includes hydrogen chloride, the processing chamber may be maintained at a temperature in a range of about 500° C. to about 650° C. In embodiments in which the etchant gas includes chlorine, the processing chamber may be maintained at a temperature in a range of about 300° C. to about 450° C. The processing chamber may be maintained at a pressure from about 0.1 Torr to about 200 Torr during the etching process.

The etching process may remove portions of the first film 60 disposed on top surfaces and upper sidewalls of the fins 52 at a rate greater than the etching process removes portions of the first film 60 disposed at the bottom of the trenches 55. For example, due to the aspect ratio of the trenches 55, the etchant gas may not penetrate to bottom portions of the trenches 55 as readily as top portions such that the top portions are etched to a greater extent than the bottom portions. Following each of the deposition processes, the etching process may be performed for a duration sufficient to completely remove the first film 60 from the top surfaces and the upper sidewalls of the dummy dielectric layer 58. In various embodiments, the first film 60 may be removed from the dummy dielectric layer 58 to a depth $D_1$ from about 1 nm to about 50 nm below a top surface of the dummy dielectric layer 58.

Residual impurities 190 may be left on exposed surfaces of the dummy dielectric layer 58 above the etched film 160. In some embodiments, the residual impurities 190 comprise halogens such as chlorine, fluorine, bromine, the like, or combinations thereof. The residual impurities 190 may remain from the etching process to remove portions of the first film 60, as described above.

Figure 10:
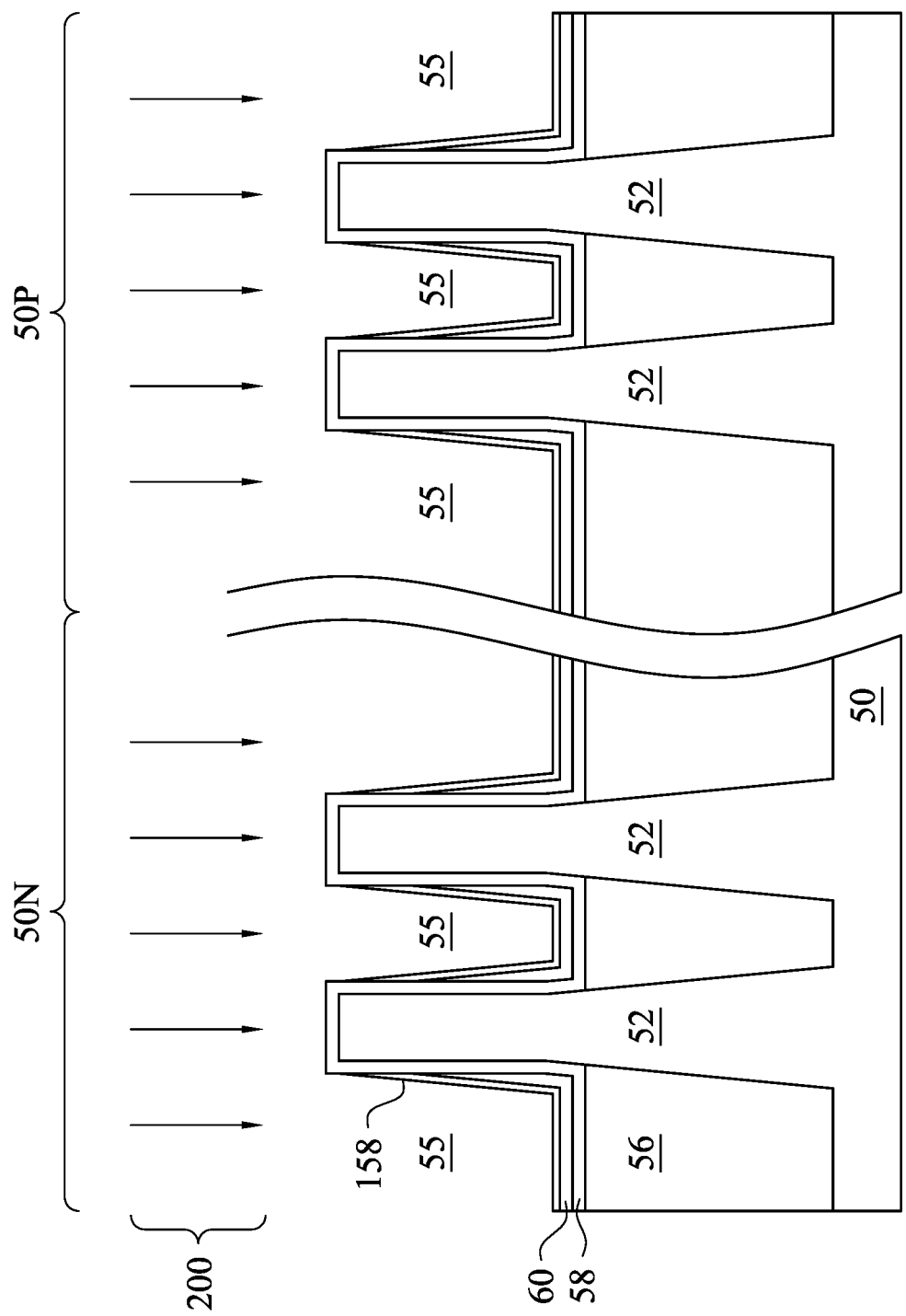

In FIG. 10, a treatment 200, sometimes referred to as a seeding enhancement treatment, is performed on the dummy dielectric layer 58 to remove the residual impurities 190. In some embodiments, the treatment 200 comprises bombarding the dummy dielectric layer 58 with radicals, such as e.g. hydroxyl radicals (OH*) and/or oxygen radicals (O*), although any suitable radicals may be utilized. The radicals may react with the residual impurities 190, removing them from the surface of the dummy dielectric layer 58. Removing at least some of the residual impurities 190 may reduce surface roughness in subsequently formed films, which may help achieve better subsequent gap-filling of the trenches 55 by preventing or reducing voids formed in the gap-filling material in the trenches 55.

The treatment 200 may be performed by supplying a treatment gas, such as a gas comprising oxygen ($O_2$) and hydrogen ($H_2$), to the processing chamber. The radicals may be produced by a chemical reaction of $O_2$ and $H_2$. The ratio of $O_2:H_2$ may be in a range of about 0.1% to about 99.9%. The treatment gas may be supplied at a flow rate in a range of about 10 sccm to about 5000 sccm, which may be advantageous for removing the residual impurities 190 and reducing surface roughness in subsequently formed films, enabling improved gap-filling. Supplying the treatment gas at a flow rate of less than about 10 sccm may be disadvantageous because it may remove fewer of the residual impurities 190, leading to greater surface roughness in subsequently formed films and poorer gap-filling capability. Supplying the treatment gas at a flow rate of more than about 5000 sccm may be disadvantageous because it may exceed operational parameters of the tools used.

The treatment 200 may be performed at a temperature in a range of about 300° C. to about 900° C., which may be advantageous for removing the residual impurities 190 and reducing surface roughness in subsequently formed films, enabling improved gap-filling. Performing the treatment 200 at a temperature of less than about 300° C. may be disadvantageous because it may generate fewer OH* and/or O* radicals and remove fewer of the residual impurities 190, leading to greater surface roughness in subsequently formed films and poorer gap-filling capability. Performing the treatment 200 at a temperature of greater than about 900° C. may be disadvantageous because it may lead to a too fast oxidation rate and may exceed operational parameters of the tools used.

The treatment 200 may be performed at a pressure in a range of about 0.01 Torr to about 760 Torr, which may be advantageous for removing the residual impurities 190 and reducing surface roughness in subsequently formed films, enabling improved gap-filling. Performing the treatment 200 at a pressure of less than about 0.01 Torr may be disadvantageous because it may remove fewer of the residual impurities 190, leading to greater surface roughness in subsequently formed films and poorer gap-filling capability. Performing the treatment 200 at a pressure of greater than about 760 Torr may be disadvantageous because it may exceed operational parameters of the tools used and lead to safety concerns.

The treatment 200 may be performed for a duration in a range between about 0.01 hours to about 10 hours, which may be advantageous for removing the residual impurities 190 and reducing surface roughness in subsequently formed films, enabling improved gap-filling. Performing the treatment 200 for a duration less than about 0.01 hours may be disadvantageous because it may remove fewer of the residual impurities 190, leading to greater surface roughness in subsequently formed films and poorer gap-filling capability. Performing the treatment 200 for a duration of greater than about 10 hours may be disadvantageous because it may lead to low throughput and high cost.

In some embodiments, the treatment 200 may produce an oxide layer 158 over the first film 60. The oxide layer 158 may be formed by OH* and/or O* radicals from the treatment 200 oxidizing the surface of first film 60. In some embodiments in which the first film 60 comprises silicon, the oxide layer 158 comprises silicon oxide (SiO) and/or silicon dioxide ($SiO_2$). The oxide layer 158 may have a thickness in a range of about 0.5 nm to about 10 nm. The oxide layer 158 may be removed by a chemical oxide removal process 300, as described below with respect to FIG. 11.

Figure 11:
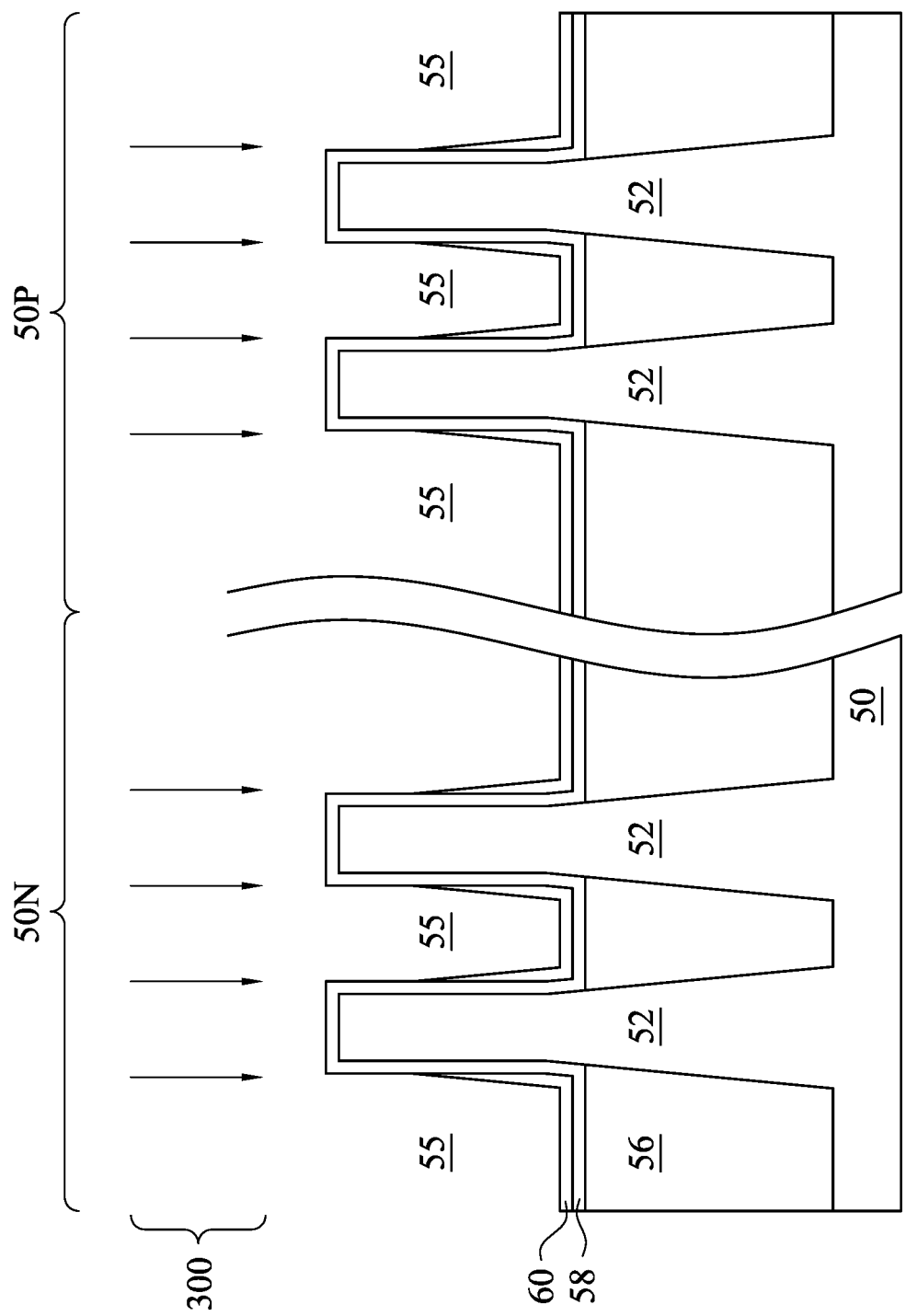

In FIG. 11, a chemical oxide removal process 300 is performed to remove the oxide layer 158, in accordance with some embodiments in which the oxide layer 158 is formed. In other embodiments, the chemical oxide removal process 300 may be omitted. Removing the oxide layer 158 may allow subsequent gap-filling to fill the trenches 55 with a uniform material, such as the dummy gate layer 62 as described below with respect to FIG. 12. This may be useful for subsequent removal of the dummy gate layer 62 by a selective etching process, as described below in respect to FIGS. 23A and 23B.

In some embodiments, the chemical oxide removal process 300 comprises a treatment with a gas comprising ammonia ($NH_3$), hydrogen fluoride (HF), nitrogen trifluoride ($NF_3$), the like, or a combination thereof. The chemical oxide removal process 300 may be performed at a temperature in a range of about 10° C. to about 90° C., which may be advantageous for removing the oxide layer 158 and improving uniformity of subsequent gap-filling. Performing the chemical oxide removal process 300 at a temperature of less than about 10° C. may be disadvantageous because it may exceed operational parameters of the tools used. Performing the treatment 200 at a temperature of greater than about 90° C. may be disadvantageous because it may lead to almost no oxidation removal rate.

The chemical oxide removal process 300 may be performed at a pressure in a range of about 0.1 Torr to about 5.0 Torr, which may be advantageous for removing the oxide layer 158 and improving uniformity of subsequent gap-filling. Performing the chemical oxide removal process 300 at a temperature of less than about 0.1 Torr may be disadvantageous because it may exceed operational parameters of the tools used. Performing the treatment 200 at a temperature of greater than about 5.0 Torr may be disadvantageous because it may exceed operational parameters of the tools used and lead to safety concerns.

The chemical oxide removal process 300 may be performed for a duration in a range of about 0.1 minutes to about 60 minutes, which may be advantageous for removing the oxide layer 158 and improving uniformity of subsequent gap-filling. Performing the chemical oxide removal process 300 for a duration of less than about 0.1 minutes may be disadvantageous because it may not fully react with the oxide layer 158. Performing the treatment 200 for a duration of greater than about 60 minutes may be disadvantageous because the etch amount may be saturated due to by-products of the treatment 200.

Figure 12:
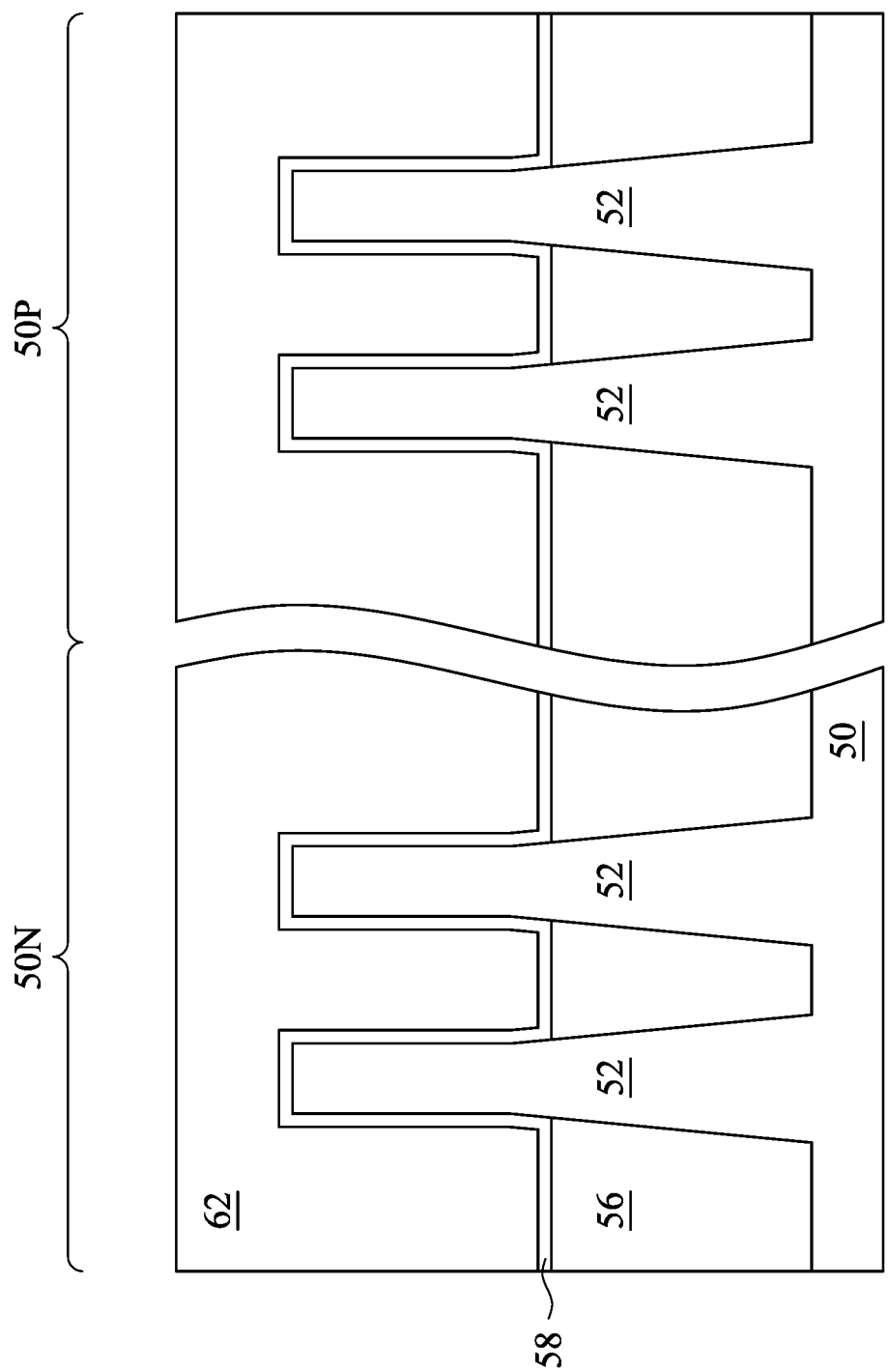

In FIG. 12, a dummy gate layer 62 incorporating the first film 60 is formed over the dummy dielectric layer 58, filling the trenches 55. The dummy gate layer 62 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals.

In some embodiments, lower portions of the dummy gate layer 62 may be formed to fill the trenches 55 by a cyclical filling process comprising multiple cycles of deposition, etching, treatment, and chemical oxide removal steps, which may be carried out in a processing chamber. For example, one cycle of the cyclical filling process may comprise a deposition step, an etching step, a treatment step, and a chemical oxide removal step. The deposition step may be performed by similar methods as the deposition of the first film 60, as described above with respect to FIG. 8. The etching step may be performed by similar methods as the etching of the first film 60, as described above with respect to FIG. 9. The treatment step may be performed by similar methods as the treatment 200, as described above with respect to FIG. 10. The chemical oxide removal step may be performed by similar methods as the chemical oxide removal process 300, as described above with respect to FIG. 11. In some embodiments, the treatment step and/or the chemical oxide removal steps may be omitted from one or more cycles.

The cyclical filling process may be performed for 1 to 10 cycles, with each cycle depositing more material along the sidewalls and bottoms of the trenches 55. In some embodiments, each cycle deposits a layer with a thickness in a range of about 1 nm to about 100 nm. The cyclical filling process may be continued until material has been deposited in the trenches 55 to a depth in a range of about 1 nm to about 100 nm, such that the remaining unfilled portions of the trenches 55 have aspect ratios less than about 1.5.

Once the cyclical filling process is complete, the upper portions of the dummy gate layer 62 may be deposited by a separate deposition process such as physical vapor deposition (PVD), CVD, sputter deposition, or other techniques for depositing the selected material. After the dummy gate layer 62 has been deposited over the dummy dielectric layer 60, it may then be planarized, such as by a CMP.

Figure 13:
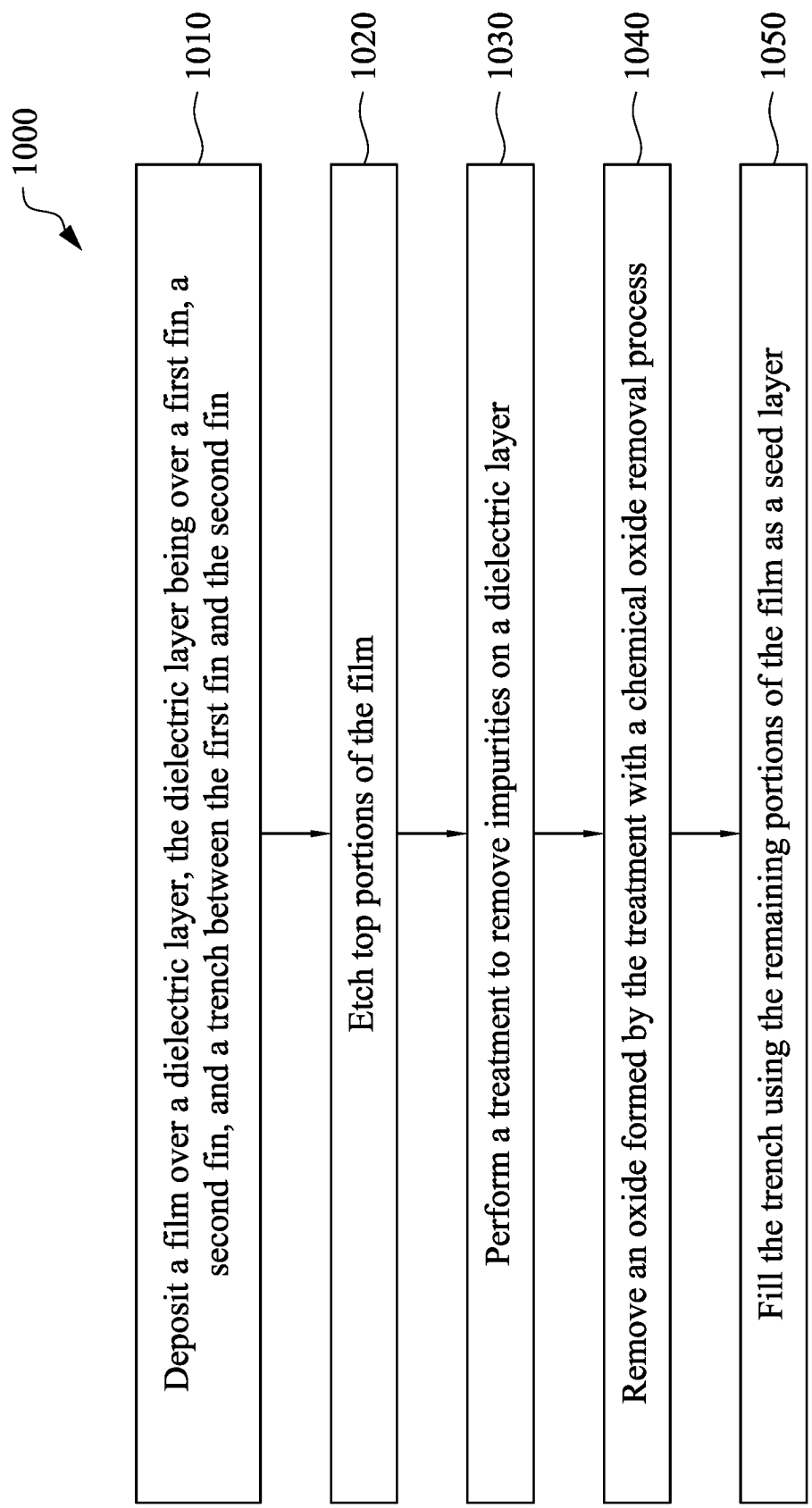
FIGS. 13, 14, 15A, 15B, and 16 are flow diagrams illustrating methods of filling gaps between fins, in accordance with some embodiments.

FIG. 13 illustrates an embodiment of a method 1000 for filling a gap (e.g. the trench 55) between fins (e.g. the fins 52) covered by a dielectric layer (e.g. the dummy dielectric layer 58), as illustrated above in FIGS. 8, 9, 10, 11, and 12. In step 1010, a first film 60 is deposited over the dummy dielectric layer 58, as described above with respect to FIG. 8. In step 1020, top portions of the first film 60 are removed by an etching process, as described above with respect to FIG. 9. In step 1030, a treatment 200 is performed as described above with respect to FIG. 10 to remove residual impurities 190 on the dummy dielectric layer 58. In step 1040, an oxide (e.g. the oxide layer 158) formed by the treatment 200 is removed by a chemical oxide removal (COR) process 300, as described above with respect to FIG. 11. In step 1050, the trench 55 is filled using the remaining portions of the first film 60 as a seed layer, as described above with respect to FIG. 12, such as by a cyclic deposition-etch-treatment-COR-deposition process comprising repeating steps 1010, 1020, 1030, and 1040 until the trench 55 has an aspect ratio less than about 1.5. However, any suitable gap-filling process may be used.

Figure 14:
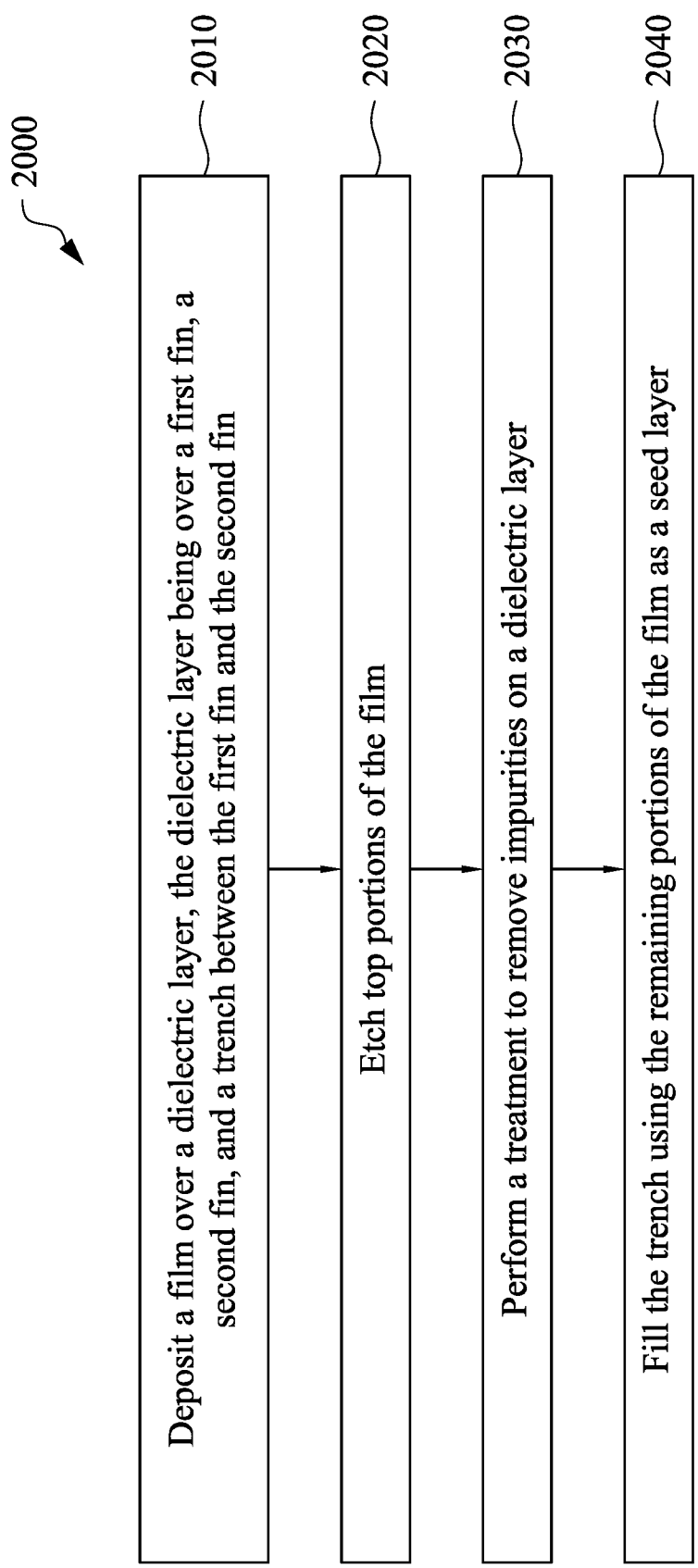

FIG. 14 illustrates an embodiment of another method 2000 for filling a gap (e.g. the trench 55) between fins (e.g. the fins 52) covered by a dielectric layer (e.g. the dummy dielectric layer 58). The method 2000 is similar to the method 1000 as described above with respect to FIG. 13, except that the step of removing an oxide formed by the treatment with a chemical oxide removal process is omitted. In step 2010, a first film 60 is deposited over the dummy dielectric layer 58, as described above with respect to FIG. 8. In step 2020, top portions of the first film 60 are removed by an etching process, as described above with respect to FIG. 9. In step 2030, a treatment 200 is performed as described above with respect to FIG. 10 to remove residual impurities 190 on the dummy dielectric layer 58. In step 1040, the trench 55 is filled using the remaining portions of the first film 60 as a seed layer.

Figure 15A:
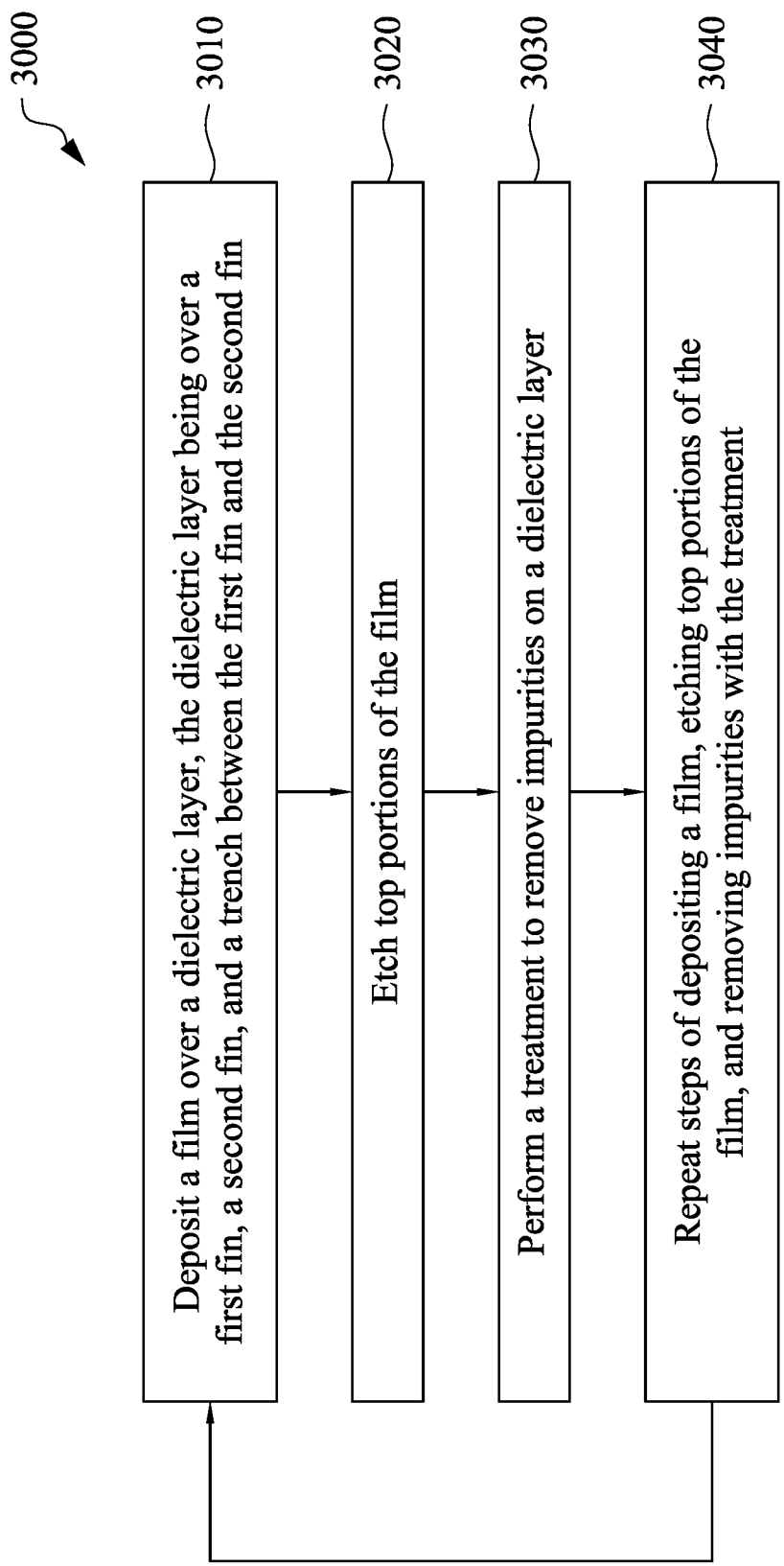

FIG. 15A illustrates an embodiment of yet another method 3000 for filling a gap (e.g. the trench 55) between fins (e.g. the fins 52) covered by a dielectric layer (e.g. the dummy dielectric layer 58), as illustrated in FIGS. 8, 9, and 10. The method 3000 is similar to the method 1000 as described above with respect to FIG. 13, except that the step of removing an oxide formed by the treatment with a chemical oxide removal process is omitted and that the trench 55 is filled in step 3040. In step 3010, a first film 60 is deposited over the dummy dielectric layer 58, as described above with respect to FIG. 8. In step 3020, top portions of the first film 60 are removed by an etching process, as described above with respect to FIG. 9. In step 3030, a treatment 200 is performed as described above with respect to FIG. 10 to remove residual impurities 190 on the dummy dielectric layer 58. In step 3040, the trench 55 is filled by a cyclic deposition-etch-treatment-deposition process comprising repeating steps 3010, 3020, and 3030 until the trench 55 is sufficiently filled, such as material has been deposited in the trench 55 to a depth in a range of about 1 nm to about 50 nm.

Figure 15B:
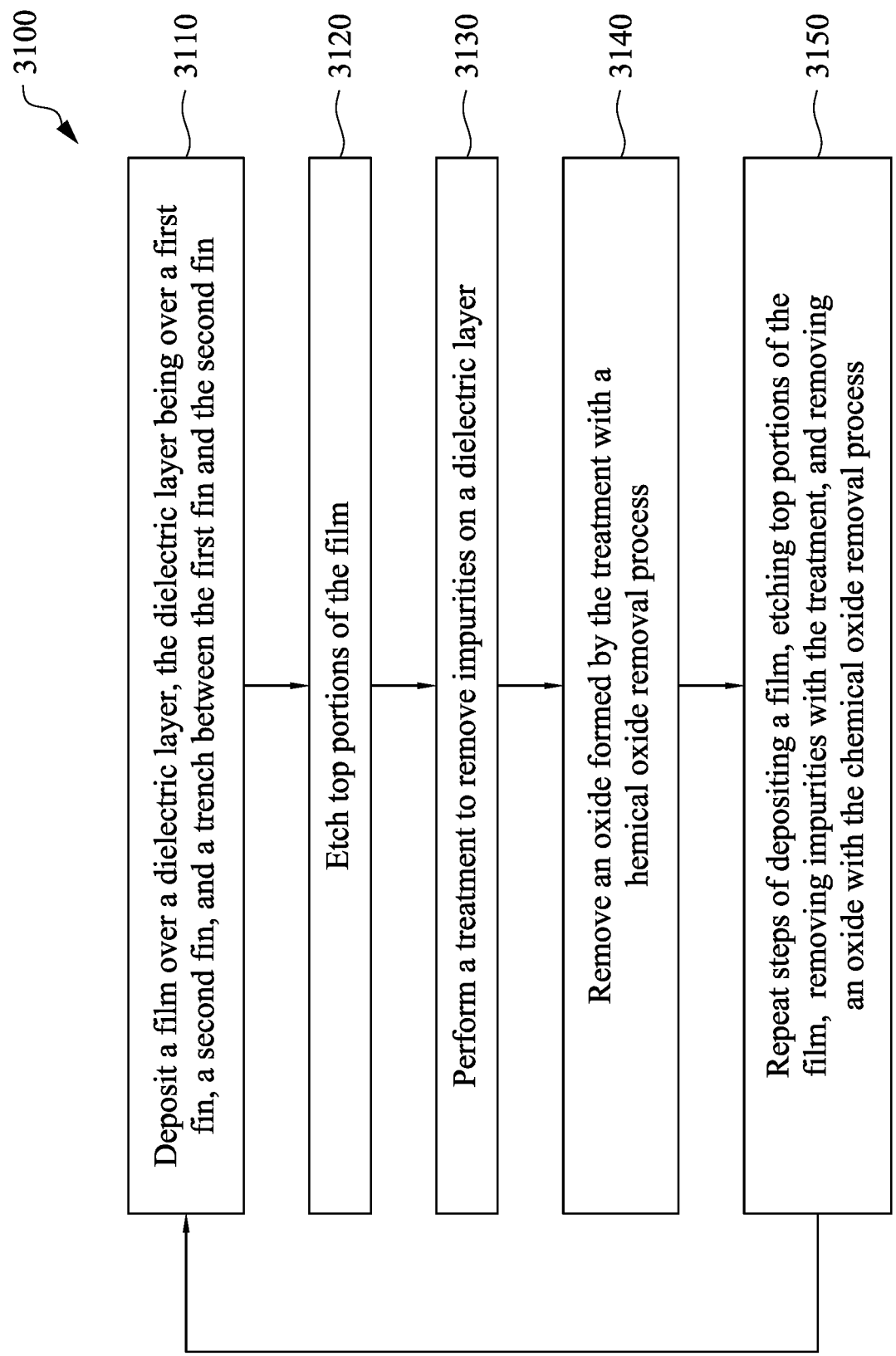

FIG. 15B illustrates an embodiment of yet another method 3100 for filling a gap (e.g. the trench 55) between fins (e.g. the fins 52) covered by a dielectric layer (e.g. the dummy dielectric layer 58). The method 3100 is similar to the method 3000 as described above with respect to FIG. 15A, except that the step of removing an oxide formed by the treatment with a chemical oxide removal process is included. In step 3110, a first film 60 is deposited over the dummy dielectric layer 58, as described above with respect to FIG. 8. In step 3120, top portions of the first film 60 are removed by an etching process, as described above with respect to FIG. 9. In step 3130, a treatment 200 is performed as described above with respect to FIG. 10 to remove residual impurities 190 on the dummy dielectric layer 58. In step 3140, an oxide (e.g. the oxide layer 158) formed by the treatment 200 is removed by a chemical oxide removal (COR) process 300, as described above with respect to FIG. 11. In step 3150, the trench 55 is filled by a cyclic deposition-etch-treatment-deposition process comprising repeating steps 3110, 3120, 3130, and 3140 until the trench 55 is sufficiently filled, such as material has been deposited in the trench 55 to a depth in a range of about 1 nm to about 50 nm.

Figure 16:
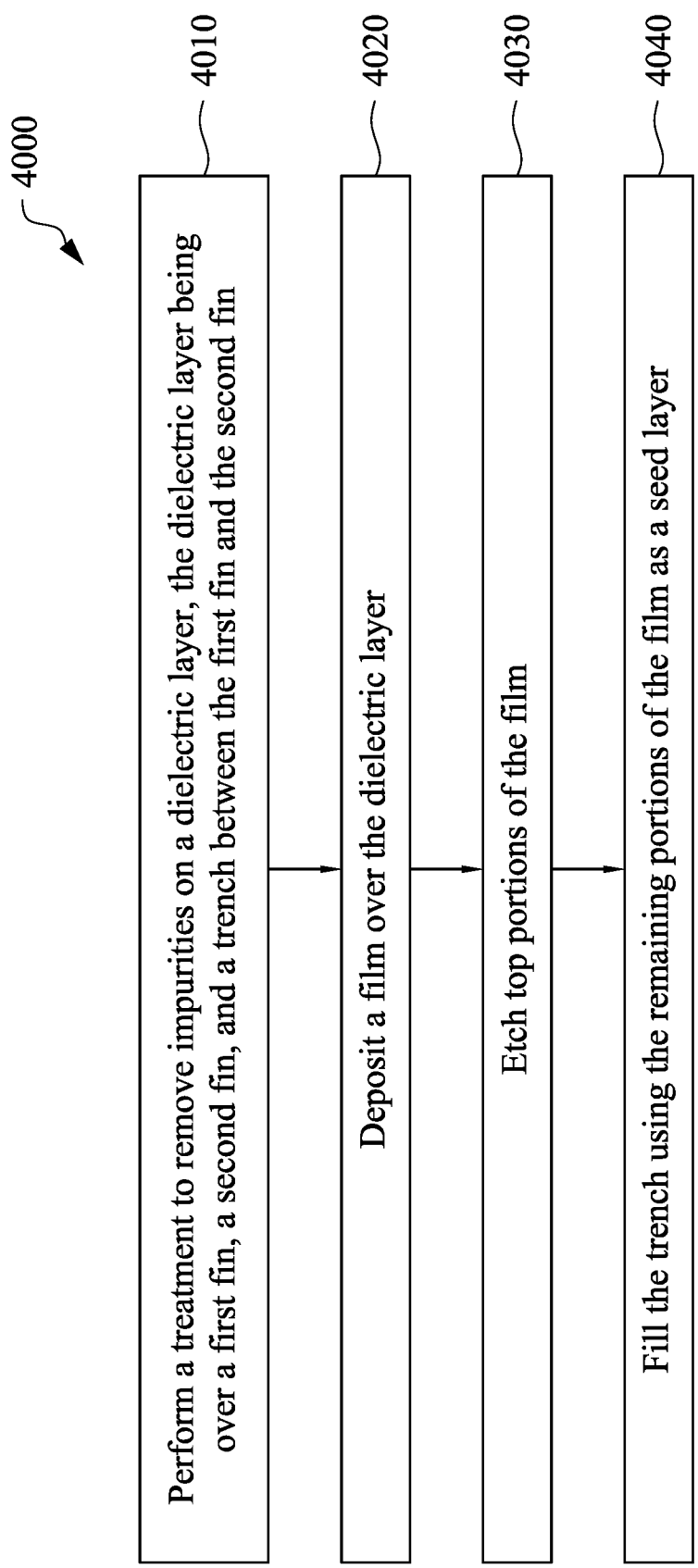

FIG. 16 illustrates an embodiment of yet another method 4000 for filling a gap (e.g. the trench 55) between fins (e.g. the fins 52) covered by a dielectric layer (e.g. the dummy dielectric layer 58). The method 4000 is similar to the method 2000 as described above with respect to FIG. 14, except that the step of performing a treatment to remove impurities is performed prior to the steps of depositing a film and etching top portions of the film. The impurities may be present on exposed surfaces of the dielectric layer from prior processes such as a cleaning process, an etching process, or as residue from a halogen-containing precursor for forming the dielectric layer such as e.g. chlorosilane or dichlorosilane, as described above with respect to FIG. 7. In step 4010, a treatment 200 is performed as described above with respect to FIG. 10 to remove impurities remaining from prior processes on the dummy dielectric layer 58. In step 4020, a first film 60 is deposited over the dummy dielectric layer 58, as described above with respect to FIG. 8. In step 4030, top portions of the first film 60 are removed by an etching process, as described above with respect to FIG. 9. In step 4040, the trench 55 is filled using the remaining portions of the first film 60 as a seed layer.

Figure 17:
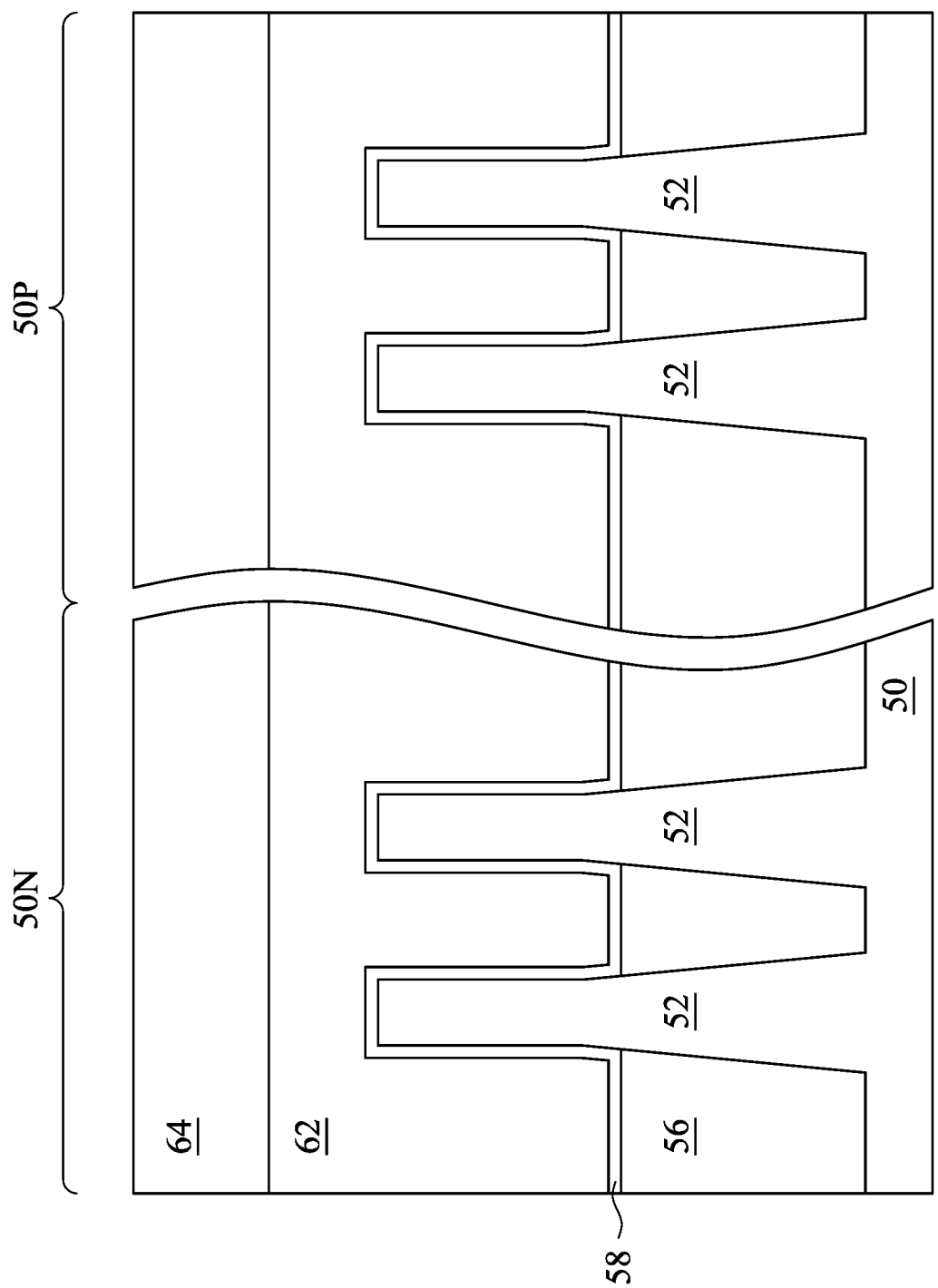
FIGS. 17, 18A, 18B, 19A, 19B, 20A, 20B, 20C, 20D, 21A, 21B, 22A, 22B, 23A, 23B, 24A, 24B, 24C, 25A, 25B, 26A, and 26B are cross-sectional views of later intermediate stages in the manufacturing of FinFETs, in accordance with some embodiments.

In FIG. 17, a mask layer 64 is deposited over the dummy gate layer 62. The mask layer 64 may include one or more layers of, for example, silicon nitride, silicon oxynitride, or the like. In this example, a single dummy gate layer 62 and a single mask layer 64 are formed across the n-type region 50N and the p-type region 50P. In the example illustrated in FIG. 17, a single dummy gate layer 62 and a single mask layer 64 are formed across the region 50N and the region 50P; however, in other embodiments, different dummy gate layers and mask layers each having one or more layers may be formed in the region 50N and the region 50P. FIGS. 18A through 26B illustrate various additional steps in the manufacturing of embodiment devices. FIGS. 18A through 26B illustrate features in either of the n-type region 50N and the p-type region 50P. For example, the structures illustrated in FIGS. 18A through 26B may be applicable to both the n-type region 50N and the p-type region 50P. Differences (if any) in the structures of the n-type region 50N and the p-type region 50P are described in the text accompanying each figure.

Figure 18A:
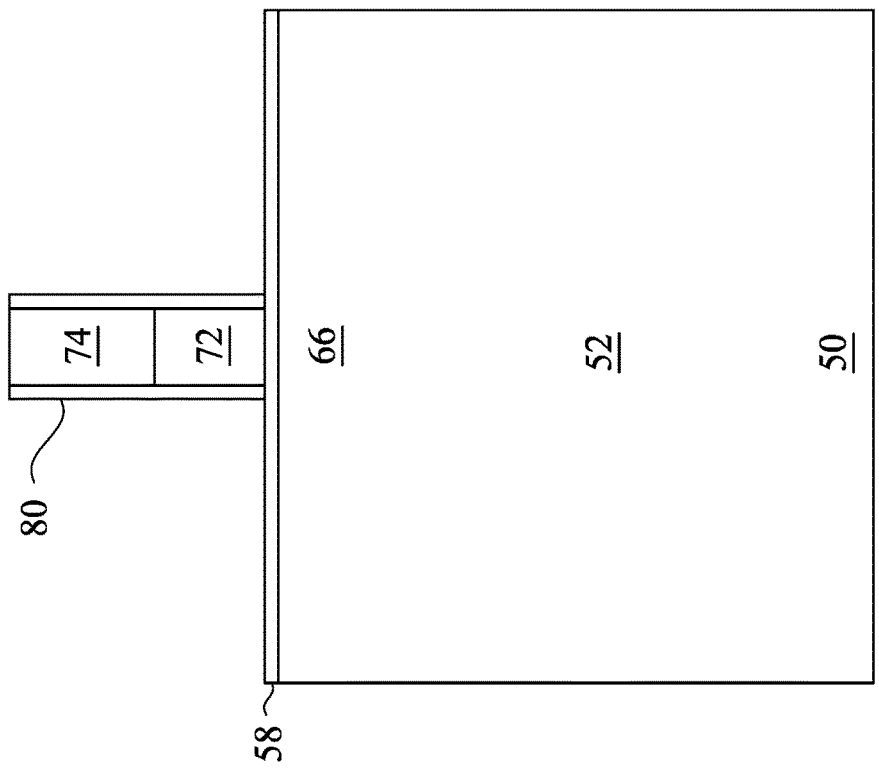
Figure 18B:
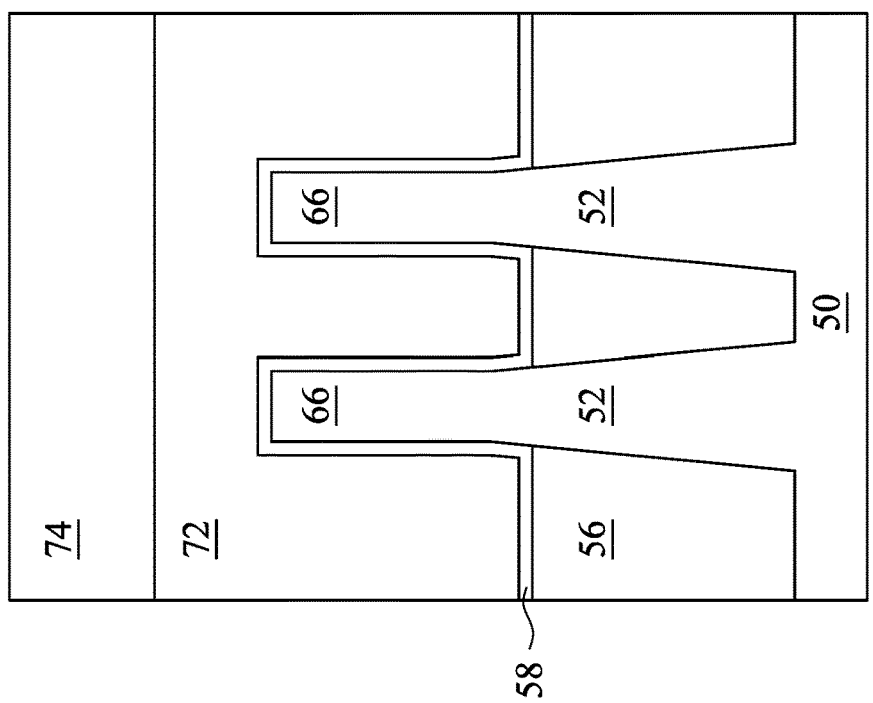

In FIGS. 18A and 18B, the mask layer 64 (see FIG. 17) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 58 by an acceptable etching technique to form dummy gates 72. The dummy gates 72 cover respective channel regions 66 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 18A and 18B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 19B:
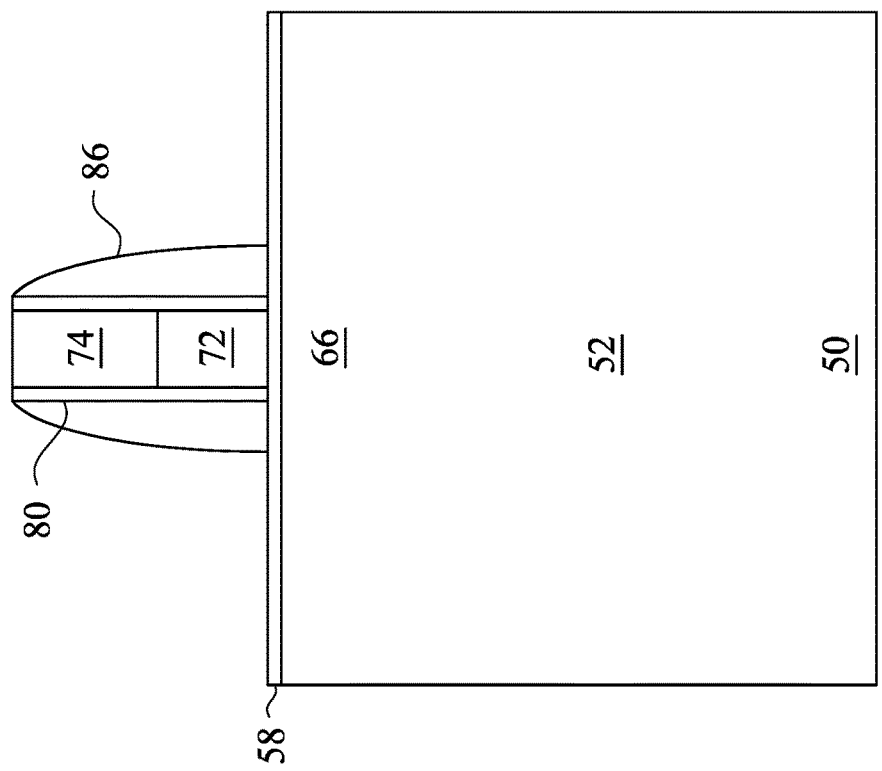
Figure 19A:
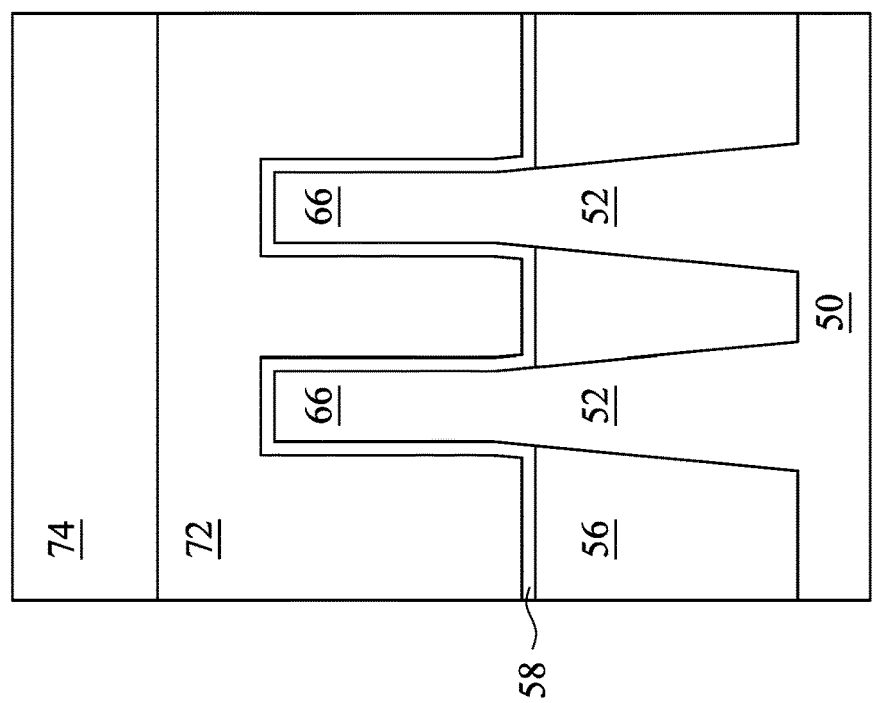

In FIGS. 19A and 19B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like). Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 20B:
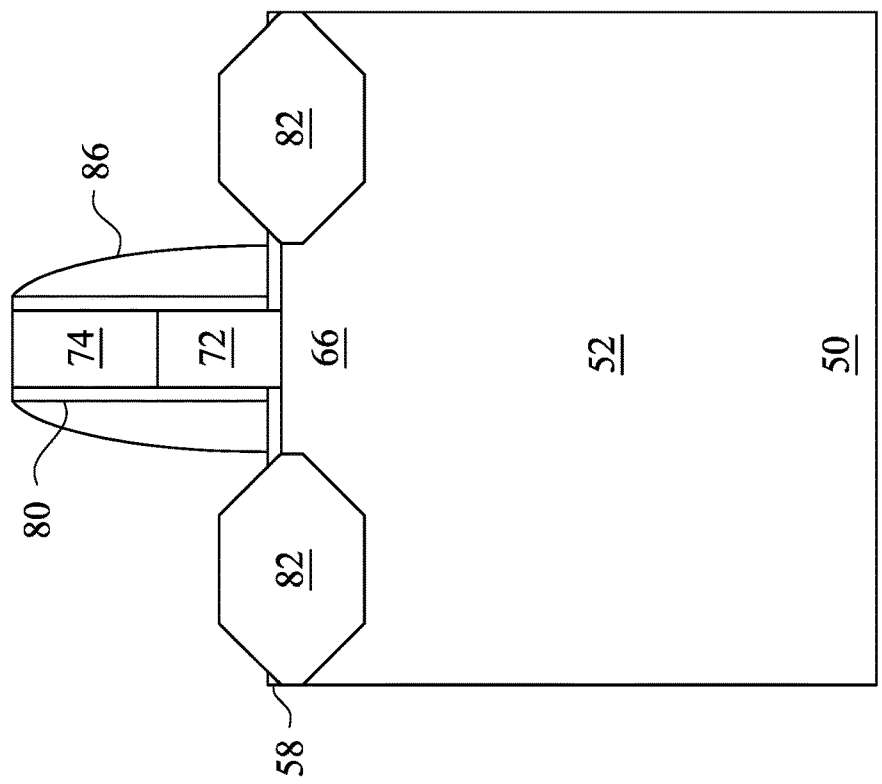
Figure 20A:
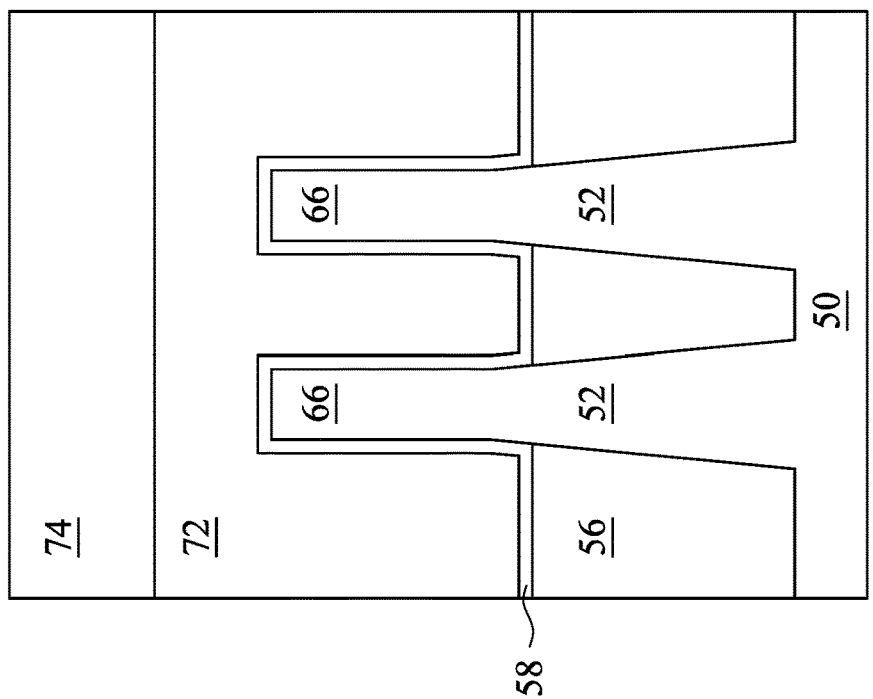
Figure 20D:
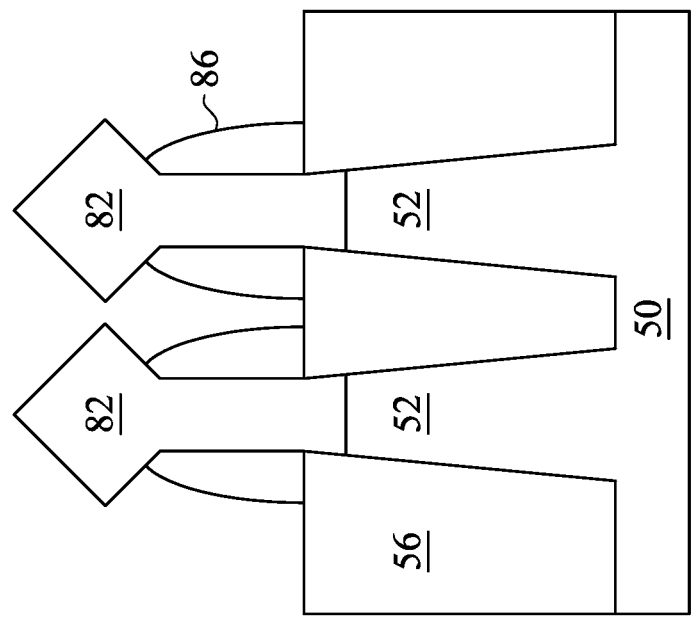
Figure 20C:
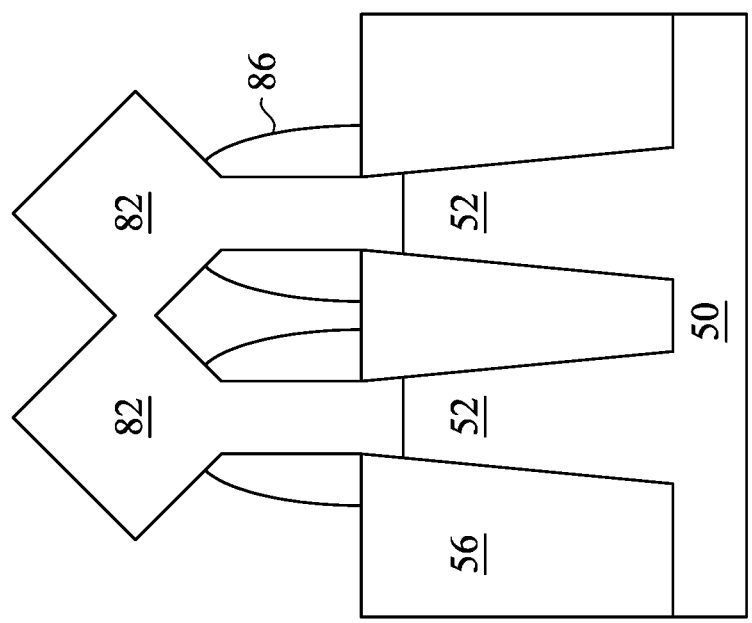

In FIGS. 20A and 20B epitaxial source/drain regions 82 are formed in the fins 52. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs. A material of the epitaxial source/drain regions 82 may be selected to exert stress in the respective channel regions 66, thereby improving performance.

The epitaxial source/drain regions 82 in the n-type region 50N may be formed by masking the p-type region 50P and etching source/drain regions of the fins 52 in the n-type region 50N to form recesses in the fins 52. Then, the epitaxial source/drain regions 82 in the n-type region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the n-type region 50N may include materials exerting a tensile strain in the channel region 66, such as silicon, silicon carbide, phosphorous doped silicon carbide, silicon phosphide, or the like. The epitaxial source/drain regions 82 in the n-type region 50N may have surfaces raised from respective surfaces of the fins 52 and may have facets.

The epitaxial source/drain regions 82 in the p-type region 50P may be formed by masking the n-type region 50N and etching source/drain regions of the fins 52 in the p-type region 50P to form recesses in the fins 52. Then, the epitaxial source/drain regions 82 in the p-type region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the p-type region 50P may comprise materials exerting a compressive strain in the channel region 66, such as silicon-germanium, boron doped silicon-germanium, germanium, germanium tin, or the like. The epitaxial source/drain regions 82 in the p-type region 50P may have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the n-type region 50N and the p-type region 50P, upper surfaces of the epitaxial source/drain regions 82 have facets which expand laterally outward beyond sidewalls of the fins 52. In some embodiments, these facets cause adjacent source/drain regions 82 of a same FinFET to merge as illustrated by FIG. 20C. In other embodiments, adjacent source/drain regions 82 remain separated after the epitaxy process is completed as illustrated by FIG. 20D. In the embodiments illustrated in FIGS. 20C and 20D, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

Figure 21B:
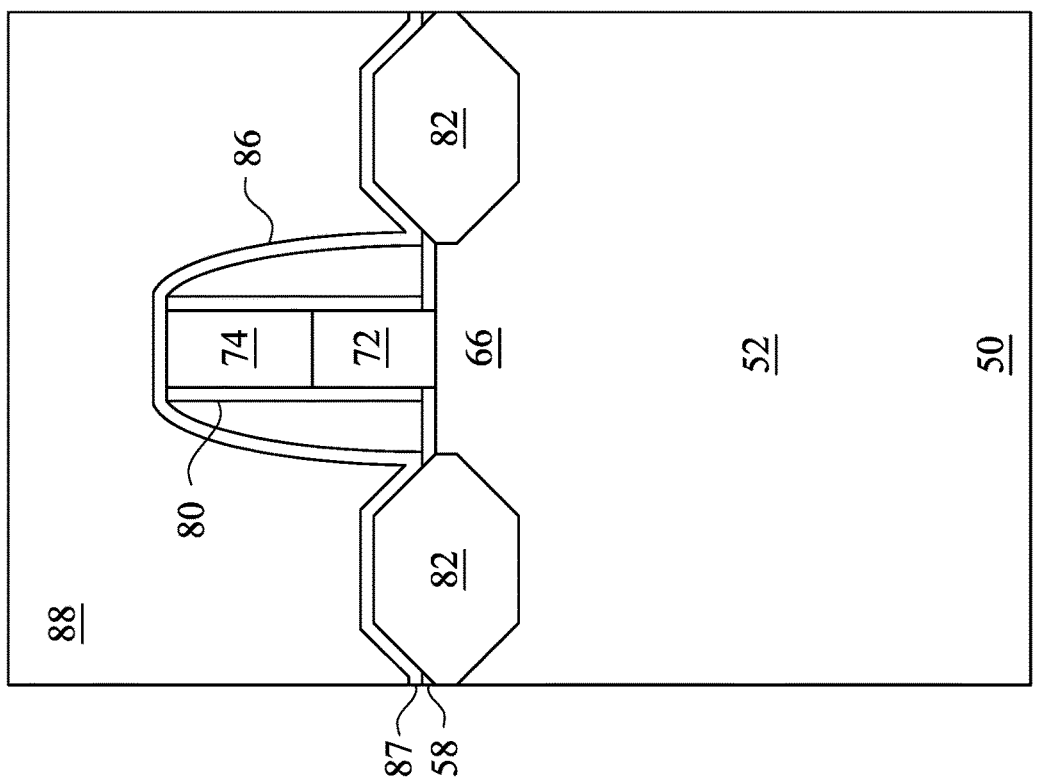
Figure 21A:
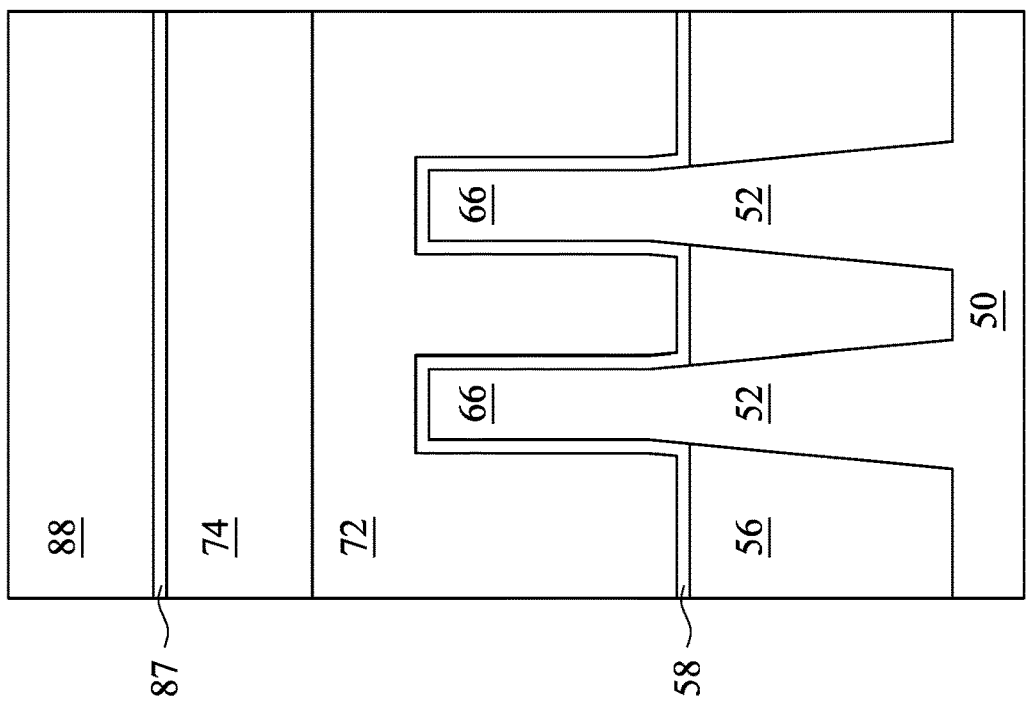

In FIGS. 21A and 21B, a first interlayer dielectric (ILD) 88 is deposited over the structure illustrated in FIGS. 20A and 20B. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a lower etch rate than the material of the overlying first ILD 88.

Figure 22B:
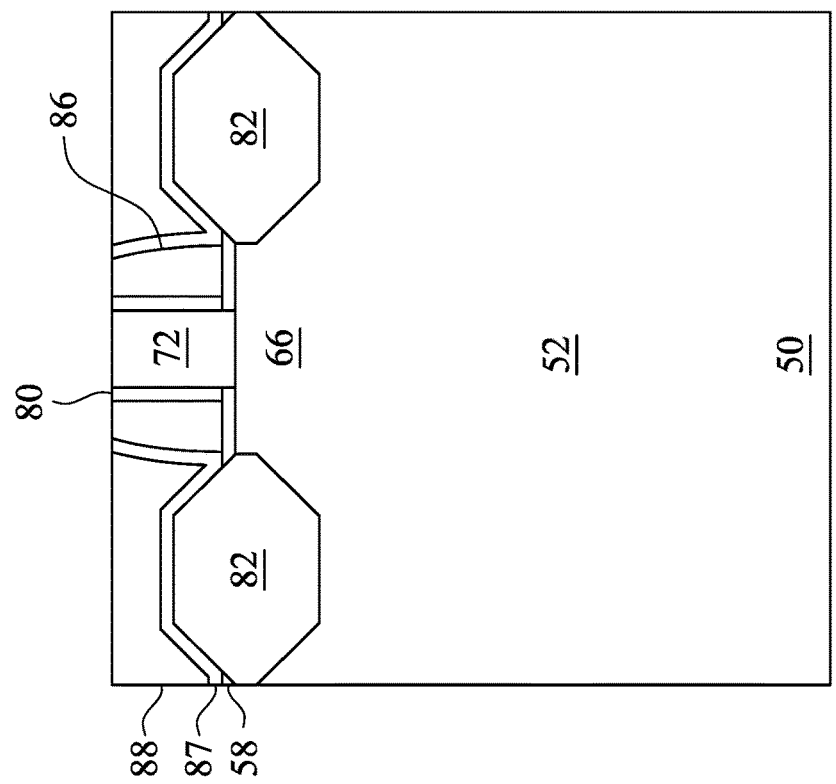
Figure 22A:
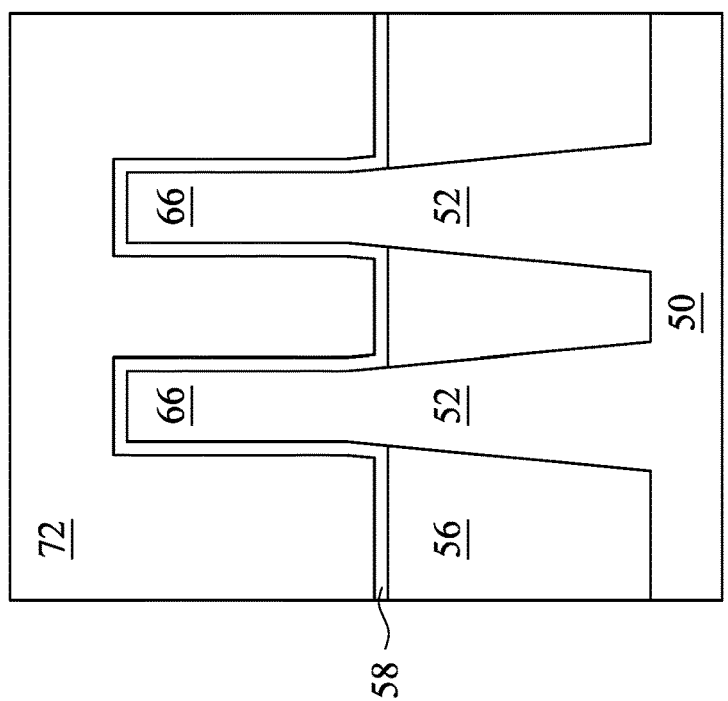

In FIGS. 22A and 22B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the masks 74.

Figure 23B:
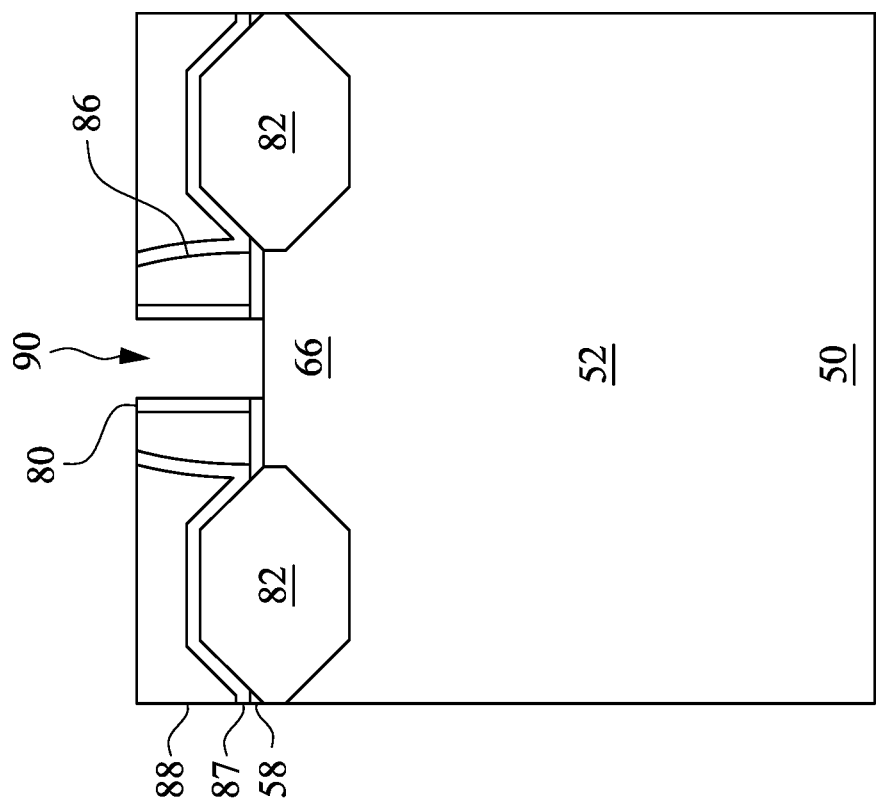
Figure 23A:
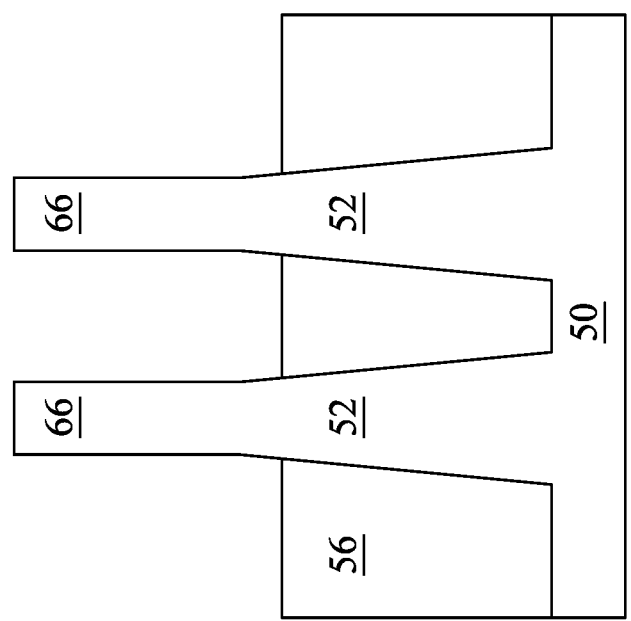

In FIGS. 23A and 23B, the dummy gates 72, and the masks 74 if present, are removed in an etching step(s), so that recesses 90 are formed. Portions of the dummy dielectric layer 58 in the recesses 90 may also be removed. In some embodiments, only the dummy gates 72 are removed and the dummy dielectric layer 58 remains and is exposed by the recesses 90. In some embodiments, the dummy dielectric layer 58 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 with little or no etching of the first ILD 88 or the gate spacers 86. Each recess 90 exposes and/or overlies a channel region 66 of a respective fin 52. Each channel region 66 is disposed between neighboring pairs of the epitaxial source/drain regions 82. During the removal, the dummy dielectric layer 58 may be used as an etch stop layer when the dummy gates 72 are etched. The dummy dielectric layer 58 may then be optionally removed after the removal of the dummy gates 72.

Figure 24B:
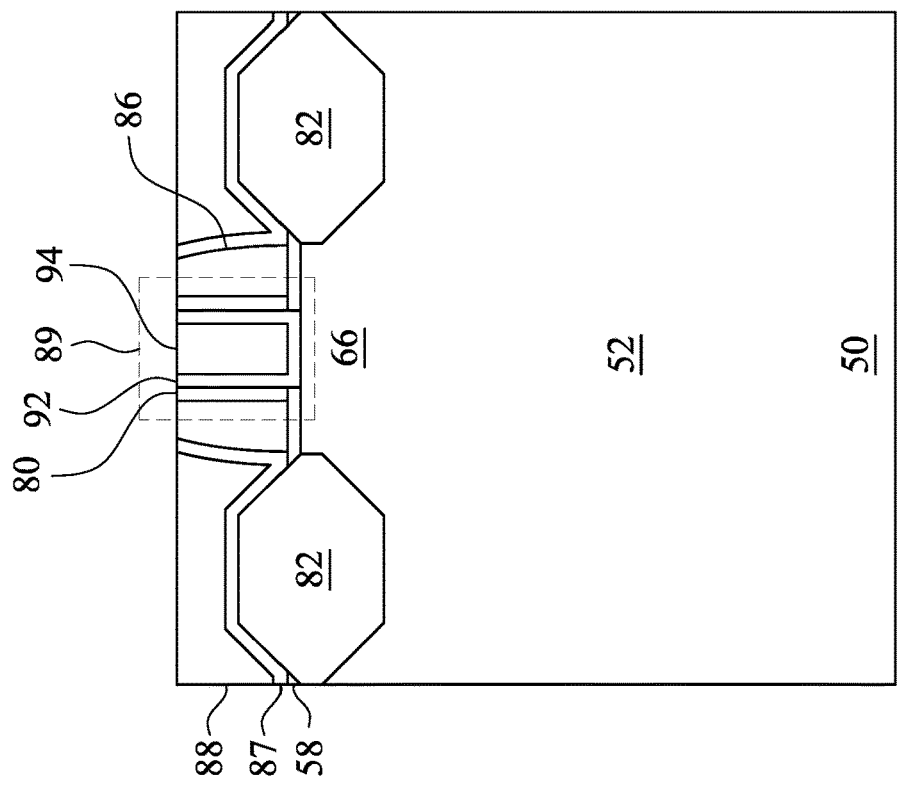
Figure 24A:
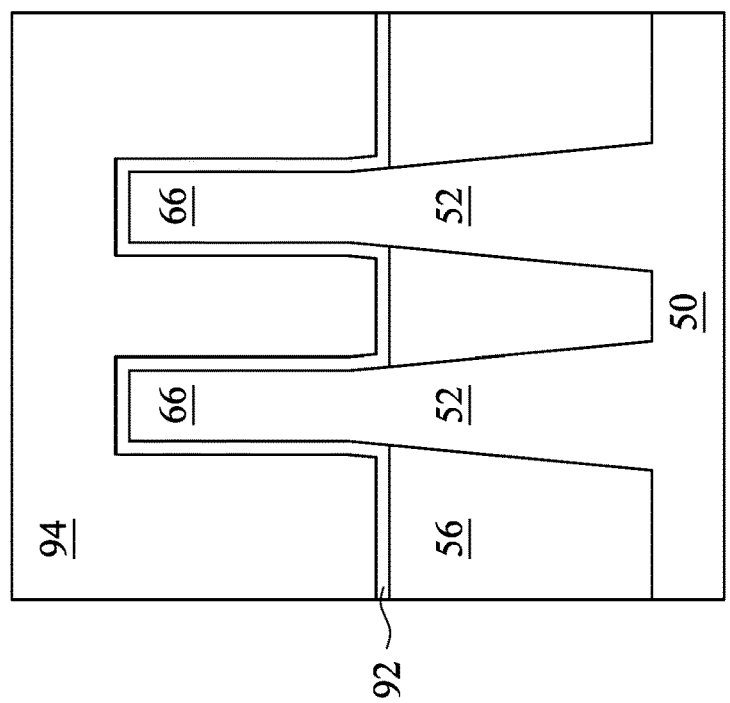
Figure 24C:
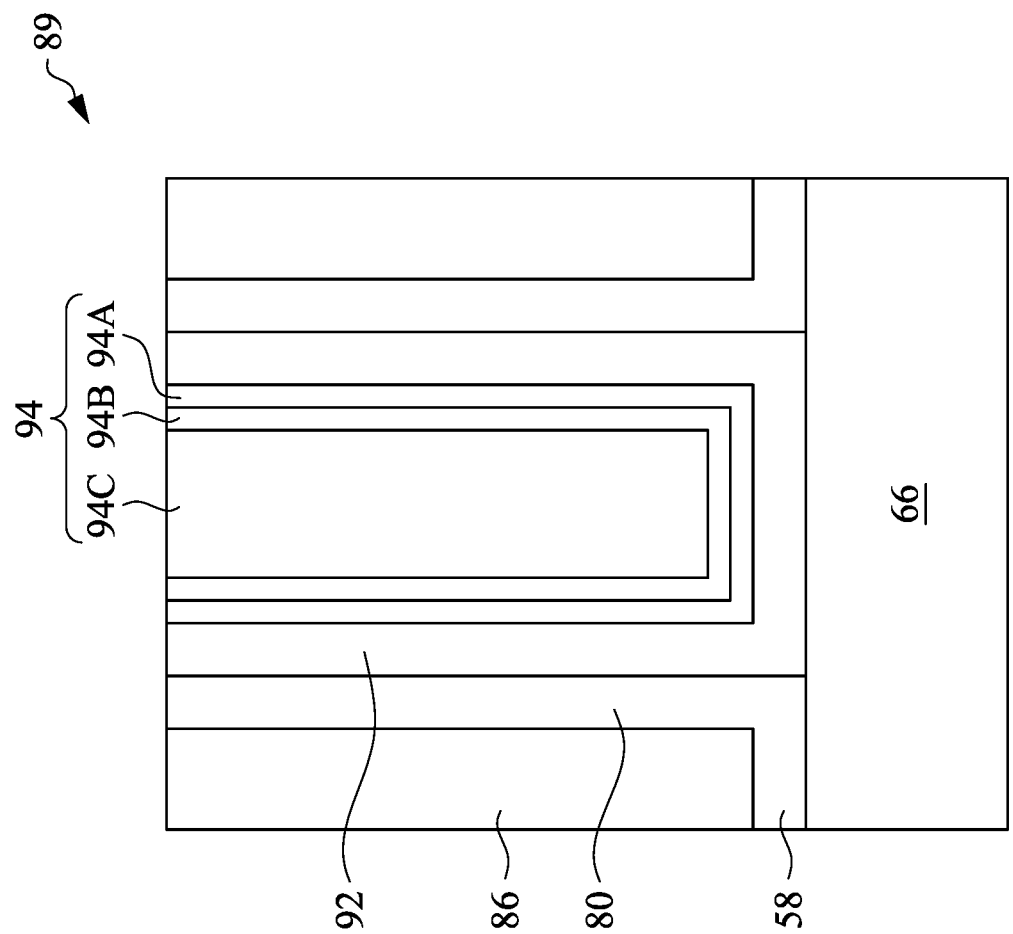

In FIGS. 24A and 24B, gate dielectric layers 92 and gate electrodes 94 are formed for replacement gates. FIG. 24C illustrates a detailed view of region 89 of FIG. 24B. Gate dielectric layers 92 one or more layers deposited in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In some embodiments, the gate dielectric layers 92 comprise one or more dielectric layers, such as one or more layers of silicon oxide, silicon nitride, metal oxide, metal silicate, or the like. For example, in some embodiments, the gate dielectric layers 92 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 92 may include a dielectric layer having a k value greater than about 7.0. The formation methods of the gate dielectric layers 92 may include Molecular-Beam Deposition (MBD), ALD, PECVD, and the like. In embodiments where portions of the dummy gate dielectric 58 remains in the recesses 90, the gate dielectric layers 92 include a material of the dummy gate dielectric 58 (e.g., $SiO_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 24B, the gate electrode 94 may comprise any number of liner layers 94A, any number of work function tuning layers 94B, and a fill material 94C as illustrated by FIG. 24C. After the filling of the recesses 90, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 66 of the fins 52.

The formation of the gate dielectric layers 92 in the n-type region 50N and the p-type region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 25B:
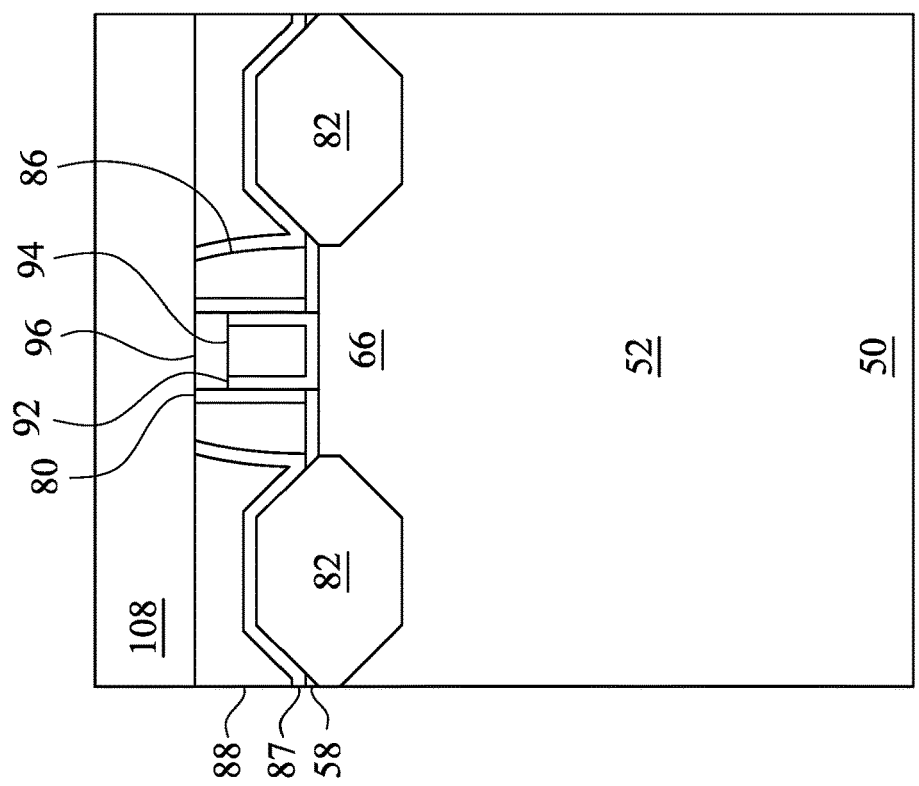
Figure 25A:
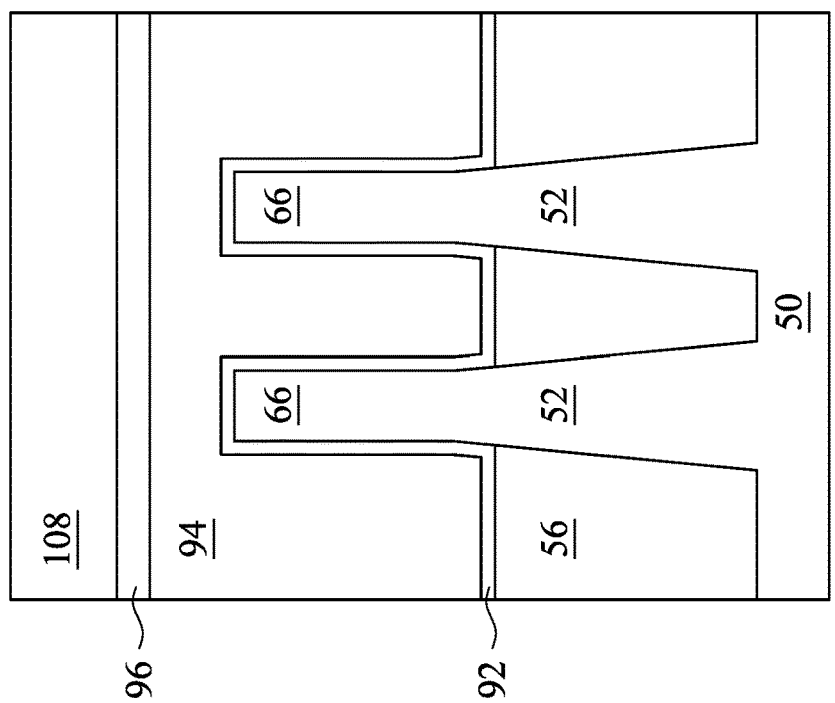

In FIGS. 25A and 25B, a gate mask 96 is formed over the gate stack (including a gate dielectric layer 92 and a corresponding gate electrode 94), and the gate mask 96 may be disposed between opposing portions of the gate spacers 86. In some embodiments, forming the gate mask 96 includes recessing the gate stack so that a recess is formed directly over the gate stack and between opposing portions of gate spacers 86. A gate mask 96 comprising one or more layers of dielectric material, such as silicon nitride, silicon oxynitride, or the like, is filled in the recess, followed by a planarization process to remove excess portions of the dielectric material extending over the first ILD 88.

As also illustrated in FIGS. 25A and 25B, a second ILD 108 is deposited over the first ILD 88. In some embodiments, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. The subsequently formed gate contacts 110 (FIGS. 26A and 26B) penetrate through the second ILD 108 and the gate mask 96 to contact the top surface of the recessed gate electrode 94.

Figure 26B:
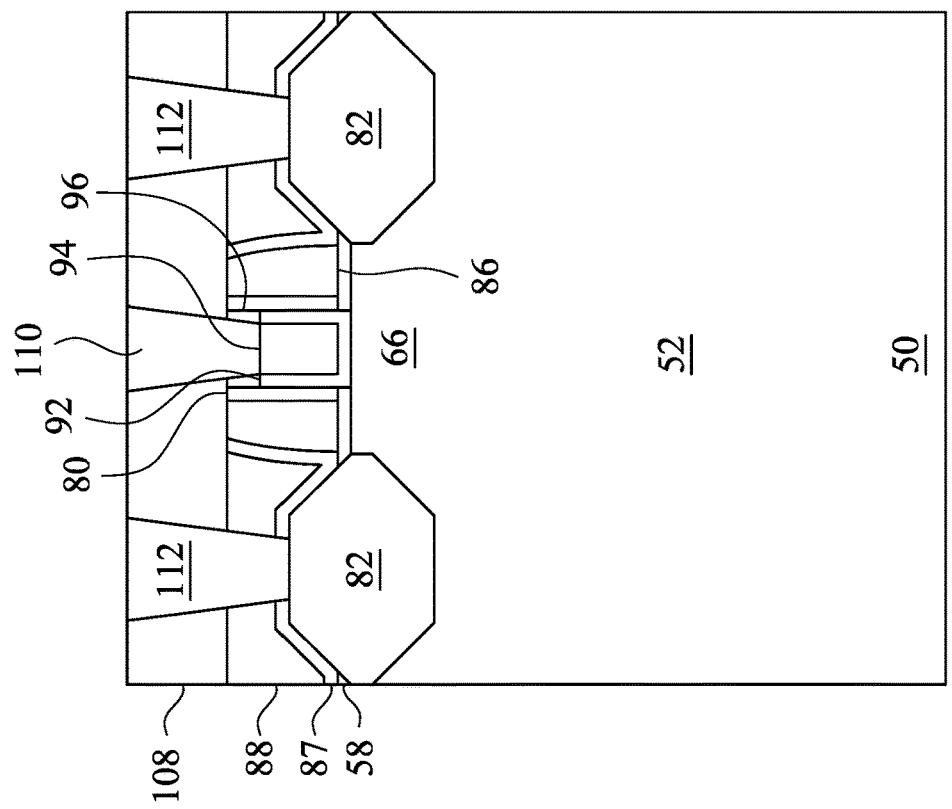
Figure 26A:
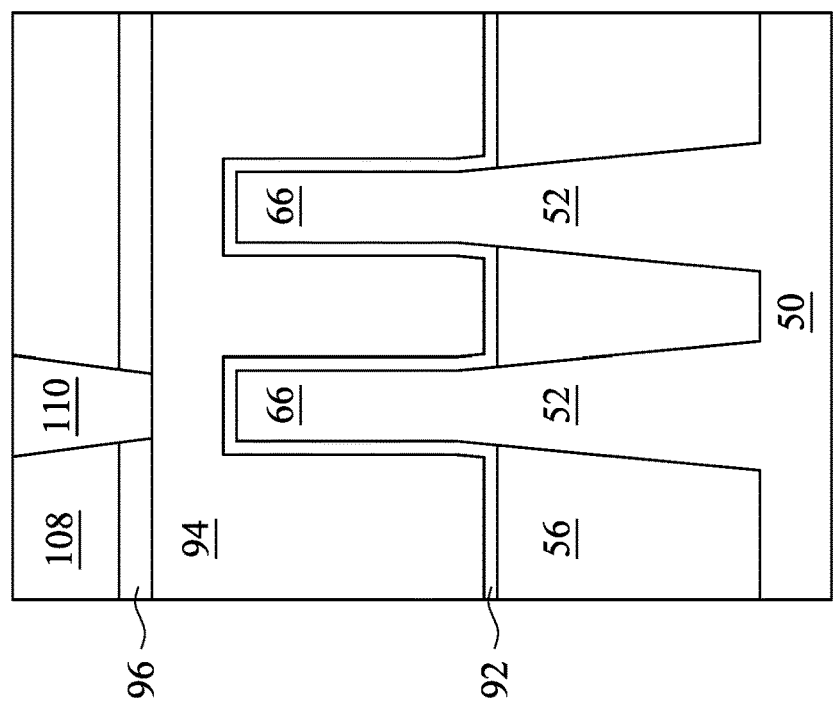

In FIGS. 26A and 26B, gate contacts 110 and source/drain contacts 112 are formed through the second ILD 108 and the first ILD 88 in accordance with some embodiments. Openings for the source/drain contacts 112 are formed through the first and second ILDs 88 and 108, and openings for the gate contact 110 are formed through the second ILD 108 and the gate mask 96. The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 106. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

Embodiments may provide advantages. A treatment with radicals such as hydroxyl (OH*) and/or oxygen (O*) radicals on a dielectric layer over gaps between fins may be useful for removing residual impurities, such as halogens, on the dielectric layer. This may be beneficial for reducing roughness of a subsequently formed film or seed layer, which may increase gap-filling capability. An oxide layer formed on the dielectric layer by the treatment may be removed with a chemical oxide removal process. This may be useful for subsequent gap-filling with a dummy gate comprising a uniform material, which may allow for a more efficient subsequent removal of the dummy gate by a selective etching process.

In accordance with an embodiment, a method of forming a semiconductor device includes: depositing a film over a dielectric layer, the dielectric layer being over a first fin, a second fin, and within a trench between the first fin and the second fin; etching top portions of the film; after etching the top portions of the film, performing a treatment on the dielectric layer to remove impurities, the treatment including bombarding the dielectric layer with radicals; and filling the trench over the remaining portions of the film. In an embodiment, the depositing the film includes using a silane as a precursor. In an embodiment, the depositing the film is performed at a temperature in a range of 100° C. to 750° C. In an embodiment, the depositing the film is performed at a pressure in a range of 0.1 Torr to 0.5 Torr. In an embodiment, the radicals include OH* or O*. In an embodiment, the etching top portions of the film is performed at a temperature in a range of 100° C. to 700° C. In an embodiment, the treatment is performed at a temperature in a range of 300° C. to 900° C. In an embodiment, the treatment is performed at a pressure in a range of 0.01 Torr to 760 Torr.

In accordance with another embodiment, a method of forming a semiconductor device includes: depositing a dielectric layer over a first fin and a second fin, the dielectric layer covering sidewalls and a bottom surface of a trench between the first fin and the second fin; forming a first film over the dielectric layer; etching top portions of the first film; removing first impurities from a surface of the dielectric layer with a bombardment of radicals, the bombardment forming a first oxide layer on remaining portions of the first film; performing a chemical oxide removal process to remove the first oxide layer; and after performing the chemical oxide removal process, filling the trench. In an embodiment, the radicals include hydroxyl radicals or oxygen radicals. In an embodiment, the filling the trench includes one or more additional cycles, each of the one or more additional cycles including: forming an additional film over the dielectric layer; etching top portions of the additional film; and removing additional impurities from the surface of the dielectric layer with a bombardment of radicals. In an embodiment, each of the one or more additional cycles further includes performing an additional chemical oxide removal process to remove an additional oxide layer. In an embodiment, the filling the trench further includes depositing upper portions of a dummy gate layer on the remaining portions of the one or more additional films. In an embodiment, the chemical oxide removal process is performed at a temperature in a range of 10° C. to 90° C. In an embodiment, the chemical oxide removal process is performed at a pressure in a range of 0.1 Torr to 5.0 Torr.

In accordance with yet another embodiment, a method of forming a semiconductor device includes: forming a first fin and a second fin, the first fin and the second fin extending from a substrate; forming a dummy dielectric layer over exposed surfaces of the first fin, the second fin, and the substrate; forming a dummy gate over the first fin and the second fin, the forming the dummy gate including a first cycle including: depositing a first film over the dummy dielectric layer; etching top portions of the first film; and removing first impurities from a surface of the dummy dielectric layer with a bombardment of hydroxyl radicals or oxygen radicals; forming an interlayer dielectric over the first fin and the second fin; and removing the dummy gate. In an embodiment, forming the dummy gate includes additional cycles, each cycle including: depositing an additional film over the dummy dielectric layer; etching top portions of the additional film; and removing second impurities from the surface of the dummy dielectric layer with another bombardment of hydroxyl radicals or oxygen radicals. In an embodiment, removing the first impurities is performed before forming the first film. In an embodiment, the first impurities are formed by the etching top portions of the first film and the removing the first impurities is performed after forming the first film. In an embodiment, the method further includes performing a chemical oxide removal process to remove an oxide layer after removing the first impurities.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   depositing a film over a dielectric layer, the dielectric layer being over a first fin, a second fin, and within a trench between the first fin and the second fin;
   etching top portions of the film;
   after etching the top portions of the film, performing a treatment on the dielectric layer to remove impurities, the treatment comprising bombarding the dielectric layer with radicals; and
   after performing the treatment on the dielectric layer to remove impurities, filling the trench over the remaining portions of the film, wherein filling the trench comprises:
   forming an additional film over the remaining portions of the film;
   etching top portions of the additional film; and
   removing impurities from the additional film by bombarding the additional film with radicals.

2. The method of claim 1, wherein the depositing the film comprises using a silane as a precursor.

3. The method of claim 1, wherein the depositing the film is performed at a temperature in a range of 100° C. to 750° C.

4. The method of claim 1, wherein the depositing the film is performed at a pressure in a range of 0.1 Torr to 0.5 Torr.

5. The method of claim 1, wherein the radicals comprise OH* or O*.

6. The method of claim 1, wherein the etching top portions of the film is performed at a temperature in a range of 100° C. to 700° C.

7. The method of claim 1, wherein the treatment is performed at a temperature in a range of 300° C. to 900° C.

8. The method of claim 1, wherein the treatment is performed at a pressure in a range of 0.01 Torr to 760 Torr.

9. The method of claim 1, wherein the treatment is performed with a flow rate in a range of 10 sccm to 5000 sccm.

10. A method of forming a semiconductor device, the method comprising:

depositing a dielectric layer over a first fin and a second fin, the dielectric layer covering sidewalls and a bottom surface of a trench between the first fin and the second fin;

forming a first film over the dielectric layer;

etching top portions of the first film;

removing first impurities from a surface of the dielectric layer with a bombardment of radicals, the bombardment forming a first oxide layer on remaining portions of the first film;

performing a chemical oxide removal process to remove the first oxide layer; and after performing the chemical oxide removal process, filling the trench, wherein filling the trench comprises one or more additional cycles, each of the one or more additional cycles comprising:

forming an additional film over the dielectric layer;

etching top portions of the additional film; and removing additional impurities from the surface of the dielectric layer with a bombardment of radicals.

11. The method of claim 10, wherein the radicals comprise hydroxyl radicals or oxygen radicals.

12. The method of claim 11, wherein each of the one or more additional cycles further comprises performing an additional chemical oxide removal process to remove an additional oxide layer.

13. The method of claim 11, wherein the filling the trench further comprises depositing upper portions of a dummy gate layer on the remaining portions of the one or more additional films.

14. The method of claim 10, wherein the chemical oxide removal process is performed at a temperature in a range of 10° C. to 90° C.

15. The method of claim 10, wherein the chemical oxide removal process is performed at a pressure in a range of 0.1 Torr to 5.0 Torr.

16. The method of claim 10, wherein the chemical oxide removal process comprises ammonia and hydrogen fluoride.

17. A method of forming a semiconductor device, the method comprising:

forming a first fin and a second fin, the first fin and the second fin extending from a substrate;

forming a dummy dielectric layer over exposed surfaces of the first fin, the second fin, and the substrate;

forming a dummy gate over the first fin and the second fin, the forming the dummy gate comprising a first cycle including:

removing first impurities from a surface of the dummy dielectric layer with a bombardment of hydroxyl radicals or oxygen radicals;

after removing the first impurities, depositing a first film over the dummy dielectric layer;

etching top portions of the first film; and forming an interlayer dielectric over the first fin and the second fin; and removing the dummy gate.

18. The method of claim 17, wherein forming the dummy gate comprises additional cycles, each cycle comprising:

depositing an additional film over the dummy dielectric layer;

etching top portions of the additional film; and removing second impurities from the surface of the dummy dielectric layer with another bombardment of hydroxyl radicals or oxygen radicals.

19. The method of claim 17, wherein the first impurities are formed by the etching top portions of the first film and the removing the first impurities is performed after forming the first film.

20. The method of claim 17 further comprising performing a chemical oxide removal process to remove an oxide layer after removing the first impurities.

* * * * *